(12) United States Patent
Shin et al.

(10) Patent No.: US 12,542,083 B2
(45) Date of Patent: Feb. 3, 2026

(54) PIXEL, DISPLAY DEVICE INCLUDING THE PIXEL, AND ELECTRONIC DEVICE

(71) Applicant: Samsung Display Co., LTD., Yongin-si (KR)

(72) Inventors: Kyoung Ju Shin, Yongin-si (KR); Dae Kil Park, Yongin-si (KR); Yun Seok Han, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/959,622

(22) Filed: Nov. 26, 2024

(65) Prior Publication Data

US 2025/0292714 A1 Sep. 18, 2025

(30) Foreign Application Priority Data

Mar. 18, 2024 (KR) .................. 10-2024-0037371

(51) Int. Cl.
*G09G 3/20* (2006.01)
*G09G 3/3258* (2016.01)

(52) U.S. Cl.
CPC .......... *G09G 3/2007* (2013.01); *G09G 3/3258* (2013.01); *G09G 2300/0819* (2013.01); *G09G 2300/0842* (2013.01); *G09G 2310/066* (2013.01); *G09G 2320/0233* (2013.01); *G09G 2320/0257* (2013.01); *G09G 2320/04* (2013.01); *G09G 2320/0653* (2013.01);
(Continued)

(58) Field of Classification Search
CPC .............. G09G 3/2007; G09G 3/3258; G09G 2300/0819; G09G 2300/0842; G09G 2310/066; G09G 2320/0233; G09G 2320/0257; G09G 2320/04; G09G 2320/0653; G09G 2320/0673; G09G 2330/023; G09G 2340/0435; G09G 2354/00
USPC ........................................................ 345/691
See application file for complete search history.

(56) References Cited

U.S. PATENT DOCUMENTS

| | | | |
|---|---|---|---|
| 11,056,049 B2 | 7/2021 | Kim et al. | |
| 11,361,713 B1* | 6/2022 | Fu ......................... | G09G 3/3241 |

(Continued)

FOREIGN PATENT DOCUMENTS

| | | |
|---|---|---|
| KR | 1020210013509 A | 2/2021 |
| KR | 1020230030130 A | 3/2023 |

*Primary Examiner* — Tom V Sheng
(74) *Attorney, Agent, or Firm* — CANTOR COLBURN LLP

(57) ABSTRACT

According to embodiments of the disclosure, a pixel includes a first transistor including a gate electrode connected to a first node, a first electrode connected to a first power line via a second node, and a second electrode connected to a first electrode of a light emitting element via a third node, a light emitting element configured to output light in response to a driving current supplied from the first transistor and including a second electrode connected to a second power line, a second transistor connected between a data line and the second node and including a gate electrode connected to a first scan line, a third transistor including a first sub-transistor and a second sub-transistor connected in series between the first node and the third node, and a first capacitor connected between a first common node between the first sub-transistor and the second sub-transistor and the first electrode.

22 Claims, 18 Drawing Sheets

(52) U.S. Cl.
CPC ............... *G09G 2320/0673* (2013.01); *G09G 2330/023* (2013.01); *G09G 2340/0435* (2013.01); *G09G 2354/00* (2013.01)

(56) References Cited

U.S. PATENT DOCUMENTS

| | | | |
|---|---|---|---|
| 11,373,588 B2 | 6/2022 | Kim et al. | |
| 11,552,149 B2 | 1/2023 | Kim et al. | |
| 11,637,164 B2 | 4/2023 | Kwak et al. | |
| 11,810,511 B2 | 11/2023 | Kim et al. | |
| 2016/0300526 A1* | 10/2016 | Lim | G09G 3/3233 |
| 2019/0305062 A1* | 10/2019 | Wang | H10K 50/805 |
| 2020/0135814 A1* | 4/2020 | Park | H10K 59/121 |
| 2020/0395424 A1* | 12/2020 | Hwang | H10K 59/1213 |
| 2022/0051625 A1* | 2/2022 | Lai | G09G 3/3233 |
| 2022/0069044 A1* | 3/2022 | Kwak | H10K 59/1213 |
| 2023/0067920 A1* | 3/2023 | Kim | G09G 3/3291 |
| 2023/0186850 A1 | 6/2023 | Wang et al. | |
| 2023/0200129 A1* | 6/2023 | Zheng | H10K 59/353 |
| | | | 257/40 |
| 2023/0245616 A1 | 8/2023 | Kim | |
| 2023/0343293 A1* | 10/2023 | Gai | G09G 3/3233 |
| 2024/0242675 A1* | 7/2024 | Kim | G09G 3/3258 |
| 2025/0185462 A1* | 6/2025 | Lee | G09G 3/3233 |
| 2025/0232711 A1* | 7/2025 | Shim | G09G 3/3233 |

* cited by examiner

M3a: M3_1a, M3_2a
M4: M4_1, M4_2

M3b: M3_1b, M3_2b
M4: M4_1, M4_2

PIXEL, DISPLAY DEVICE INCLUDING THE PIXEL, AND ELECTRONIC DEVICE

This application claims priority to Korean Patent Application No. 10-2024-0037371, filed on Mar. 18, 2024, and all the benefits accruing therefrom under 35 U.S.C. § 119, the content of which in its entirety is herein incorporated by reference.

BACKGROUND

1. Field

The disclosure relates to a pixel, a display device including the pixel, and an electronic device.

2. Description of the Related Art

As information technology develops, importance of a display device, which is a connection medium between a user and information, is emerging. In response to this, a use of a display device such as, for example, a liquid crystal display device and an organic light emitting display device is increasing.

Recently, in some display devices, a function of high-speed driving that provides an image switched in a high frame frequency to a user and a function of a low-speed driving that provides an image switched in a low frame frequency to the user may be required. To this end, a pixel driven at a high speed and a low speed and capable of stably implementing a luminance at a high grayscale and a low grayscale is desired.

SUMMARY

An object of the disclosure is to provide a pixel that may stably implement a luminance by minimizing a leakage current when implementing a high grayscale and a low grayscale, a display device including the pixel, and an electronic device. In some aspects, when a leakage current is minimized when implementing the high grayscale and the low grayscale, the display device may be stably driven at a high speed and a low speed.

An object of the disclosure is to provide a pixel capable of constantly maintaining a direction of a leakage current when implementing a high grayscale and a low grayscale, and a display device including the pixel.

According to embodiments of the disclosure, a pixel includes a first transistor including a gate electrode connected to a first node, a first electrode connected to a first power line via a second node, and a second electrode connected to a first electrode of a light emitting element via a third node, a light emitting element configured to output light in response to a driving current supplied from the first transistor and including a second electrode connected to a second power line, a second transistor connected between a data line and the second node and including a gate electrode connected to a first scan line, a third transistor including a first sub-transistor and a second sub-transistor connected in series between the first node and the third node, and a first capacitor connected between a first common node between the first sub-transistor and the second sub-transistor and the first electrode of the light emitting element.

According to an embodiment, a gate electrode of the first sub-transistor and the second sub-transistor is connected to a second scan line, and a turn-on period of the first sub-transistor and the second sub-transistor and a turn-on period of the second transistor at least partially overlap.

According to an embodiment, a gate electrode of the first sub-transistor and the second sub-transistor is connected to the first scan line.

According to an embodiment, the pixel further includes a fourth transistor connected in series between the first node and a third power line and including a third sub-transistor and a fourth sub-transistor including a gate electrode connected to a third scan line, and a fifth transistor connected between the first electrode of the light emitting element and a fourth power line and including a gate electrode connected to a fourth scan line.

According to an embodiment, the pixel further includes a second capacitor connected between a constant power and a second common node between the third sub-transistor and the fourth sub-transistor.

According to an embodiment, the pixel further includes a sixth transistor connected between the first power line and the second node and including a gate electrode connected to an emission control line, a seventh transistor connected between the third node and the first electrode of the light emitting element and including a gate electrode connected to the emission control line, an eighth transistor connected between the second node and a fifth power line and including a gate electrode connected to the fourth scan line, and a storage capacitor connected between the first power line and the first node.

According to an embodiment, the constant power is one of first driving power supplied to the first power line, second driving power supplied to the second power line, first initialization power supplied to the third power line, second initialization power supplied to the fourth power line, and bias power supplied to the fifth power line.

According to an embodiment of the disclosure, a pixel includes a first transistor including a gate electrode connected to a first node, a first electrode connected to a first power line via a second node, and a second electrode connected to a first electrode of a light emitting element via a third node, a light emitting element outputting light in response to a driving current supplied from the first transistor and including a second electrode connected to a second power line, a second transistor connected between a data line and the third node and including a gate electrode connected to a first scan line, a third transistor including a first sub-transistor and a second sub-transistor connected in series between the first node and the second node, and a first capacitor connected between a first common node between the first sub-transistor and the second sub-transistor and the first electrode of the light emitting element.

According to an embodiment, a gate electrode of the first sub-transistor and the second sub-transistor is connected to a second scan line, and a turn-on period of the first sub-transistor and the second sub-transistor and a turn-on period of the second transistor at least partially overlap.

According to an embodiment, a gate electrode of the first sub-transistor and the second sub-transistor is connected to the first scan line.

According to an embodiment, the pixel further includes a fourth transistor connected in series between the first node and a third power line and including a third sub-transistor and a fourth sub-transistor including a gate electrode connected to a third scan line, and a fifth transistor connected between the first electrode of the light emitting element and a fourth power line and including a gate electrode connected to a fourth scan line.

According to an embodiment, the pixel further includes a second capacitor connected between a constant power and a second common node between the third sub-transistor and the fourth sub-transistor.

According to an embodiment, the pixel further includes a sixth transistor connected between the first power line and the second node and including a gate electrode connected to an emission control line, a seventh transistor connected between the third node and the first electrode of the light emitting element and including a gate electrode connected to the emission control line, an eighth transistor connected between the second node and a fifth power line and including a gate electrode connected to the fourth scan line, and a storage capacitor connected between the first power line and the first node.

According to an embodiment, the constant power is one of first driving power supplied to the first power line, second driving power supplied to the second power line, first initialization power supplied to the third power line, second initialization power supplied to the fourth power line, and bias power supplied to the fifth power line.

According to an embodiment of the disclosure, a display device includes pixels connected to scan lines, emission control lines, and data lines, and at least one of the pixels includes a first transistor including a gate electrode connected to a first node, a first electrode connected to a first power line via a second node, and a second electrode connected to a first electrode of a light emitting element via a third node, a light emitting element configured to output light in response to a driving current supplied from the first transistor and including a second electrode connected to a second power line, a second transistor connected between a specific data line among the data lines and the second node or the third node, the second transistor including a gate electrode connected to a first scan line included among the scan lines, a third transistor connected in series between the first node and the second node or the third node, the third transistor including a first sub-transistor and a second sub-transistor each including a gate electrode connected to a second scan line included among the scan lines, and a first capacitor connected between a first common node between the first sub-transistor and the second sub-transistor and the first electrode of the light emitting element.

According to an embodiment, the second transistor is connected between the specific data line and the second node, and the third transistor is connected between the first node and the third node, or the second transistor is connected between the specific data line and the third node, and the third transistor is connected between the first node and the second node.

According to an embodiment, the first scan line and the second scan line are the same scan line.

According to an embodiment, the pixel further includes a fourth transistor connected in series between the first node and a third power line and including a third sub-transistor and a fourth sub-transistor including a gate electrode connected to a third scan line, a fifth transistor connected between the first electrode of the light emitting element and a fourth power line and including a gate electrode connected to a fourth scan line, and a second capacitor connected between a constant power and a second common node between the third sub-transistor and the fourth sub-transistor.

According to an embodiment, the pixel further includes a sixth transistor connected between the first power line and the second node and including a gate electrode connected to an emission control line, a seventh transistor connected between the third node and the first electrode of the light emitting element and including a gate electrode connected to the emission control line, an eighth transistor connected between the second node and a fifth power line and including a gate electrode connected to the fourth scan line, and a storage capacitor connected between the first power line and the first node.

According to an embodiment, the constant power is one of first driving power supplied to the first power line, second driving power supplied to the second power line, first initialization power supplied to the third power line, second initialization power supplied to the fourth power line, and bias power supplied to the fifth power line.

According to an embodiment of the disclosure, an electronic device includes a display panel including pixels, a display module including drivers for controlling the display panel, and a processor configured to control the display module, and at least one of the pixels includes a first transistor including a gate electrode connected to a first node, a first electrode connected to a first power line via a second node, and a second electrode connected to a first electrode of a light emitting element via a third node, a light emitting element configured to output light in response to a driving current supplied from the first transistor and including a second electrode connected to a second power line, a second transistor connected between a specific data line included among data lines and the second node or the third node, the second transistor including a gate electrode connected to a first scan line included among scan lines, a third transistor connected in series between the first node and the second node or the third node, the third transistor including a first sub-transistor and a second sub-transistor each including a gate electrode connected to a second scan line included among the scan lines, and a first capacitor connected between a first common node between the first sub-transistor and the second sub-transistor and the first electrode of the light emitting element.

According to an embodiment, the first scan line and the second scan line are the same scan line.

Objects of the disclosure are not limited to the object described herein, and other technical objects which are not described will be clearly understood by those skilled in the art from the following description.

In accordance with a pixel and a display device including the pixel according to embodiments of the disclosure, a leakage current direction of a driving transistor is maintained constant regardless of a grayscale (high grayscale and low grayscale), and thus display quality may be improved.

In some aspects, in accordance with a pixel and a display device including the pixel according to embodiments of the disclosure, a gate electrode voltage change of a driving transistor due to a leakage current may be minimized, and thus display quality may be improved.

However, an effect of the disclosure is not limited to the above-described effect, and may be variously extended within a range that does not deviate from the spirit and scope of the disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
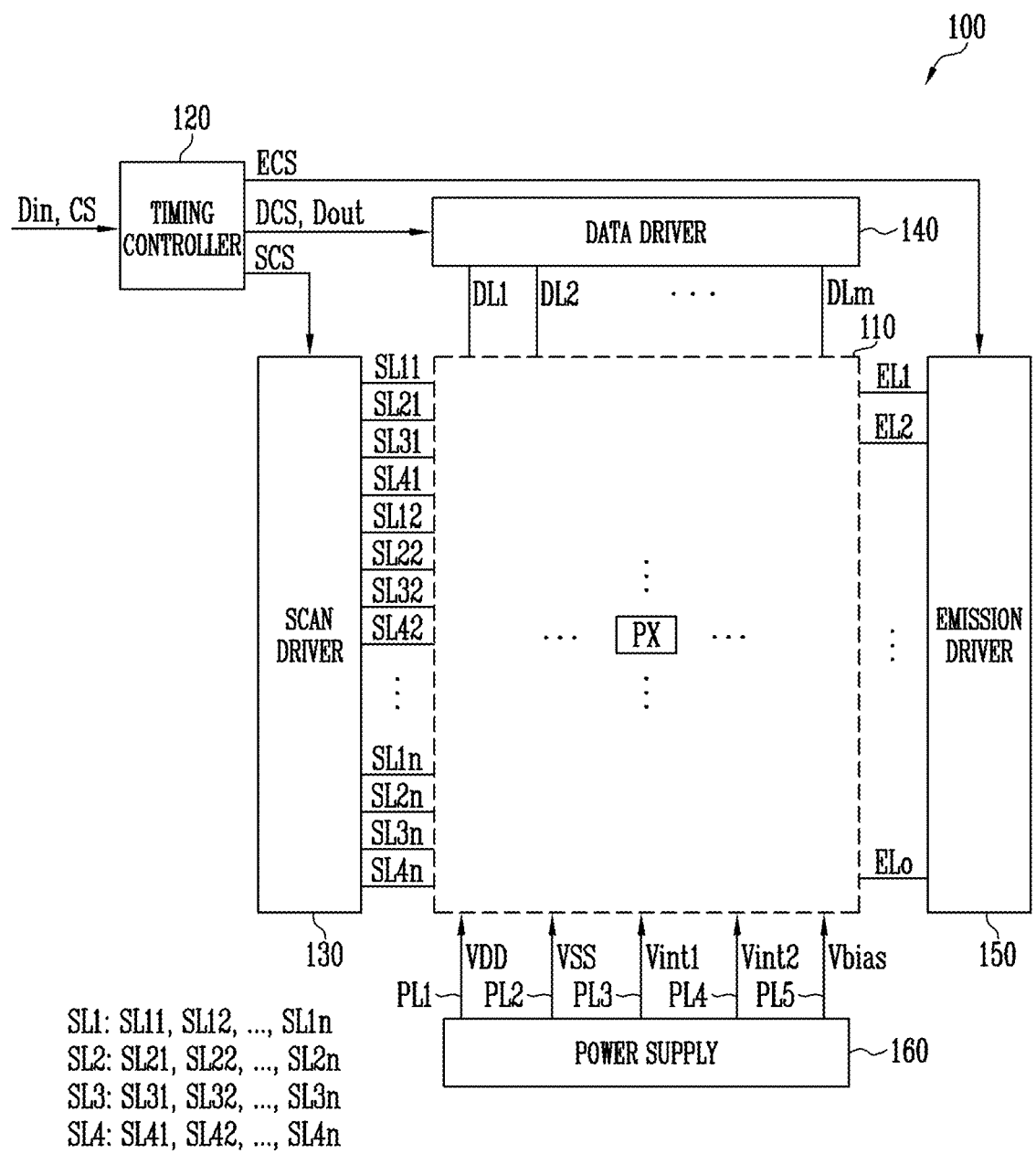
FIG. 1 is a diagram illustrating a display device according to an embodiment of the disclosure.

Hereinafter, various embodiments of the disclosure will be described in detail with reference to the accompanying drawings such that those skilled in the art may easily carry out the disclosure. The disclosure may be implemented in various different forms and is not limited to the embodiments described herein.

In order to clearly describe the disclosure, parts that are not related to the description are omitted, and the same or similar elements are denoted by the same reference numerals throughout the specification. Therefore, the above-described reference numerals may be used in other drawings.

In some aspects, the expression "is the same" in the description may mean "is substantially the same". That is, the expression "is the same" may be the same enough for those of ordinary skill to understand that it is the same. Other expressions may also be expressions in which "substantially" is omitted.

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In some aspects, each block, unit, and/or module may be implemented by dedicated hardware, or a combination of dedicated hardware that performs some functions and a processor (for example, one or more programmed microprocessors and related circuits) that performs a function different from those of the dedicated hardware. In some aspects, in some embodiments, the block, unit, and/or module may be physically separated into two or more interact individual blocks, units, and/or modules without departing from the scope of the inventive concepts. In some aspects, in some embodiments, the block, unit and/or module may be physically combined into more complex blocks, units, and/or modules without departing from the scope of the inventive concepts.

A term "connection" between two configurations may mean that both of an electrical connection and a physical connection are used inclusively, but is not limited thereto. For example, "connection" used based on a circuit diagram may mean an electrical connection, and "connection" used based on a cross-sectional view and a plan view may mean a physical connection.

The terms "about" or "approximately" as used herein are inclusive of the stated value and include a suitable range of deviation for the particular value as determined by one of ordinary skill in the art, considering the measurement in question and the error associated with measurement of the particular quantity. The term "about" can mean within one or more standard deviations, or within ±30%, 20%, 10%, 5% of the stated value, for example.

The term "substantially," as used herein, means approximately or actually. The term "substantially equal" means approximately or actually equal. The term "substantially the same" means approximately or actually the same. The term "substantially perpendicular" means approximately or actually perpendicular. The term "substantially parallel" means approximately or actually parallel.

Although a first, a second, and the like are used to describe various components, these components are not limited by these terms. These terms are used to distinguish one component from another component. Therefore, a first component described herein may be a second component within the technical spirit of the disclosure. The singular expression includes the plural expression unless the context clearly dictates otherwise.

In some embodiments, the disclosure is not limited to the embodiments disclosed below, and may be modified in various forms and may be implemented. In some aspects, each of the embodiments disclosed below may be implemented alone or in combination with at least one of other embodiments.

Figure 2:
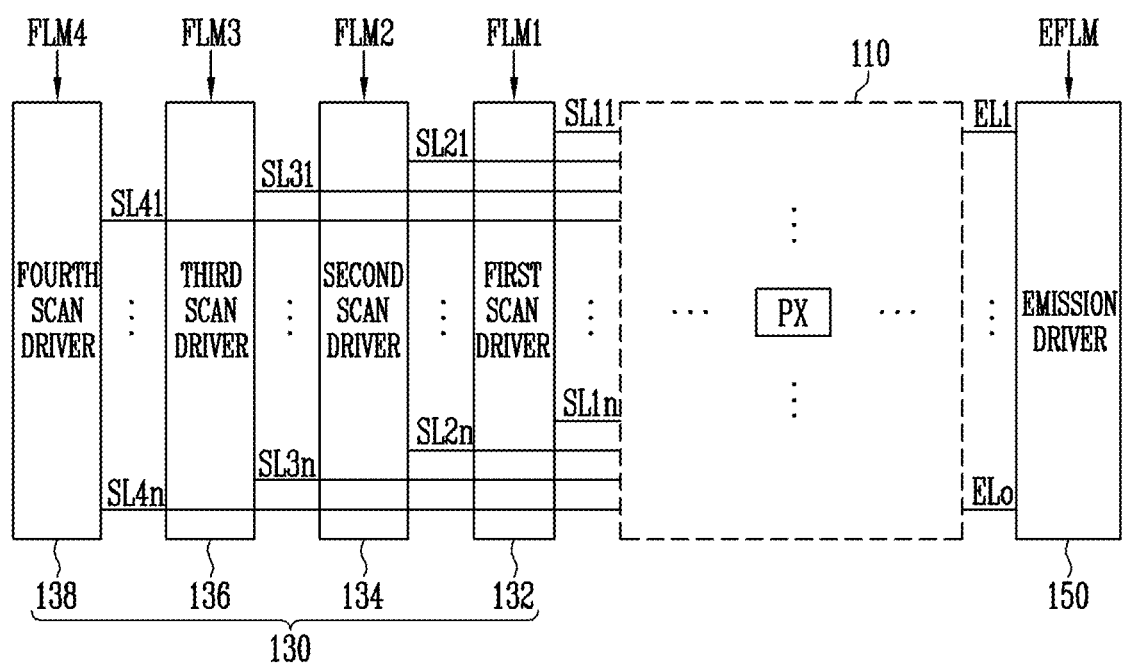
FIG. 2 is a diagram illustrating an embodiment of a scan driver and an emission driver illustrated in FIG. 1.

FIG. 1 is a diagram illustrating a display device according to an embodiment of the disclosure. FIG. 2 is a diagram illustrating an embodiment of a scan driver and an emission driver illustrated in FIG. 1.

Referring to FIG. 1, the display device 100 according to an embodiment of the disclosure may include a pixel unit 110 (or a display panel), a timing controller 120, the scan driver 130, a data driver 140, the emission driver 150, and a power supply 160 may be provided.

The display device 100 may display an image at various image refresh rates (driving frequencies, or screen reproduction rate) according to a driving condition. The image refresh rate refers to a frequency at which a data signal is written to a driving transistor of a pixel PX. For example, the image refresh rate may be referred to as a screen scan rate or a screen reproduction rate, and may indicate a frequency at which a display screen is reproduced per second.

In an embodiment, an output frequency of the data driver for one horizontal line (for example, pixels PX connected to the same scan line may be classified into one horizontal line (or pixel row)) and/or an output frequency of a first scan driver 132 outputting a first scan signal (or write scan signal) may be determined in correspondence with the image refresh rate. For example, the image refresh rate for moving image driving may be a frequency of about 60 Hz or higher (for example, 120 Hz, 240 Hz, 360 Hz, or the like).

For example, the display device 100 may display an image in correspondence with various image refresh rates of 1 Hz to 360 Hz. However, this is an example, and the display device 100 may display an image at an image refresh rate of 360 Hz or higher (for example, 480 Hz).

The pixel unit 110 may include pixels PX connected to scan lines (for example, first scan lines SL11, SL12, ..., and SL1n, second scan lines SL21, SL22, ..., and SL2n, third scan lines SL31, SL32, ..., and SL3n, fourth scan lines SL41, SL42, ..., and SL4n, data lines DL1, DL2, ..., and DLm, emission control lines EL1, EL2, ..., and ELo and power lines PL1, PL2, PL3, PL4, and PL5 (here, n, m, o are natural numbers equal to or greater than 3).

For example, a pixel PXij (refer to FIG. 3) positioned on an i-th horizontal line (or pixel row) and a j-th vertical line (or pixel column) may be connected to an i-th first scan line SL1i, an i-th second scan line SL2i, an i-th third scan line SL3i, an i-th fourth scan line SL4i, a k-th emission control line ELk, and a j-th data line DLj (here, i is a natural number equal to or less than n, j is a natural number equal to or less than m, and k is a natural number equal to or less than o). Here, k may be a number equal to i or less than i. In an example in which each of the emission control lines EL1 to ELo is connected to a pixel PX positioned on one horizontal line, k may be the same number as i. In an example in which each of the emission control lines EL1 to ELo is connected to pixels PX positioned on two or more horizontal lines, k may be a number less than i.

The pixels PX may be selected in a horizontal line unit when an enable first scan signal is supplied to the first scan lines SL11 to SL1n, and the pixels PX selected by the enable first scan signal may receive a data signal from a data line (one of DL1 to DLm) connected thereto. The pixels PX receiving the data signal may generate light of a predetermined luminance in response to a voltage of the data signal.

The scan driver 130 may receive a scan driving signal SCS from the timing controller 120. The scan driving signal SCS may include at least one scan start signal and clock signals associated with driving the scan driver 130. The scan driver 130 may generate a first scan signal, a second scan signal, a third scan signal, and a fourth scan signal in response to the scan start signal and the clock signals.

The scan signal may have a gate-on voltage (for example, enable) or a gate-off voltage (for example, disable). Thereafter, the enable scan signal may mean that the gate-on voltage is supplied to the scan lines SL1, SL2, SL3, and SL4, and the disable scan signal may mean that the gate-off voltage is supplied to the scan lines SL1, SL2, SL3, and SL4.

As illustrated in FIG. 2, the scan driver 130 may include a first scan driver 132, a second scan driver 134, a third scan driver 136, and a fourth scan driver 138. According to a design, at least some of the scan drivers 132, 134, 136, and 138 may be integrated into one driver circuit, module, or the like.

The first scan driver 132 may receive a first scan start signal FLM1 and generate the enable first scan signal by shifting the first scan start signal FLM1 in response to the clock signal. The first scan driver 132 may sequentially supply the enable first scan signal to first scan lines SL11 to SL1n. In an embodiment, the first scan driver 132 may supply the enable first scan signal during a write period of an active period of one frame.

The second scan driver 134 may receive a second scan start signal FLM2 and generate an enable second scan signal by shifting the second scan start signal FLM2 in response to the clock signal. The second scan driver 134 may sequentially supply the enable second scan signal to the second scan lines SL21 to SL2n. In an embodiment, the second scan driver 134 may supply the enable second scan signal during the write period of the active period of one frame.

The third scan driver 136 may receive a third scan start signal FLM3 and generate an enable third scan signal by shifting the third scan start signal FLM3 in response to the clock signal. The third scan driver 136 may sequentially supply the enable third scan signal to third scan lines SL31 to SL3n. In an embodiment, the third scan driver 136 may supply the enable third scan signal during the write period of the active period of one frame.

The fourth scan driver 138 may receive a fourth scan start signal FLM4 and generate an enable fourth scan signal by shifting the fourth scan start signal FLM4 in response to the clock signal. The fourth scan driver 138 may sequentially supply the enable fourth scan signal to fourth scan lines SL41 to SL4n. In an embodiment, the fourth scan driver 138 may supply the enable fourth scan signal during the write period of the active period of one frame. In an embodiment, the fourth scan driver 138 may supply the enable fourth scan signal during a maintenance period included in a blank section of one frame. In an embodiment, when the maintenance period is included in the active period of one frame, the fourth scan driver 138 may supply the enable fourth scan signal during the corresponding maintenance period.

For example, the fourth scan driver 138 may perform scanning once during the write period of one frame (that is, supply at least one enable fourth scan signal) and perform scanning at least once according to the image refresh rate during the maintenance period of one frame. Here, when the image refresh rate is reduced (that is, a frame length is increased), since the blank period of one frame is increased, the number of maintenance periods included in one frame may be increased. That is, when the image refresh rate is reduced, the number of repetitions of an operation of supplying the enable fourth scan signal may be increased.

Figure 3:
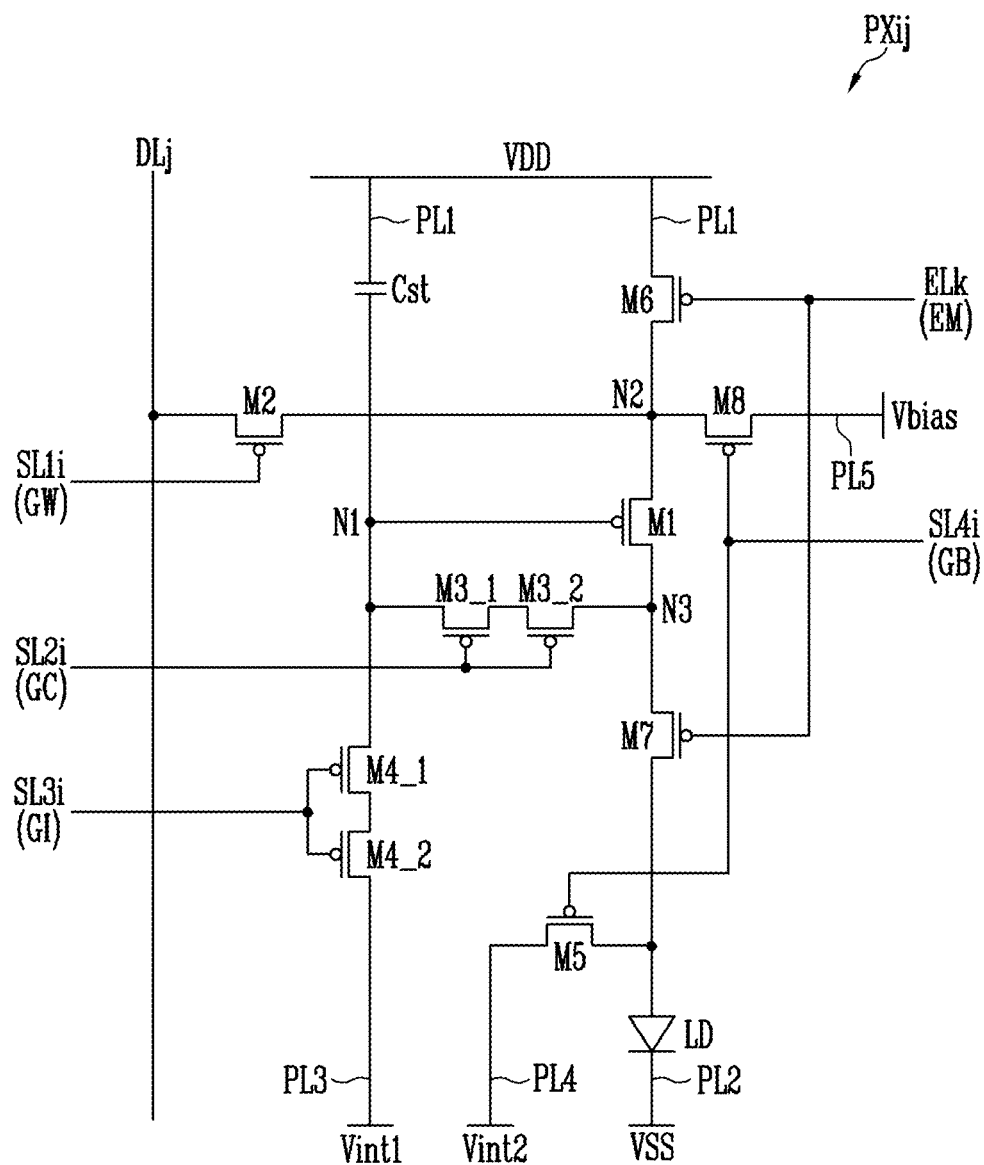
FIG. 3 is a diagram illustrating a pixel according to an embodiment of the disclosure.

For example, as illustrated in FIG. 3, an enable first scan signal GW, an enable second scan signal GC, an enable third scan signal GI, and an enable fourth scan signal GB supplied to a P-type transistor may be a low level voltage.

In FIG. 2, the first scan driver 132, the second scan driver 134, the third scan driver 136 and the fourth scan driver 138 are illustrated to be connected to the respective first scan line SL1, second scan line SL2, third scan line SL3, and fourth scan line SL4, but embodiments of the present disclosure are not limited thereto. For example, at least two (at least two of SL1, SL2, SL3, and SL4) of the first scan line SL1, the second scan line SL2, the third scan line SL3, and the fourth scan line SL4 may be driven by one scan driver.

The data driver 140 may receive output data Dout and a data driving signal DCS from the timing controller 120. The data driving signal DCS may include sampling signals and/or timing signals associated with driving the data driver 140. The data driver 140 may generate a data signal based on the data driving signal DCS and the output data Dout. For example, the data driver 140 may generate an analog data signal based on a grayscale of the output data Dout. The data driver 140 may supply the data signal in one horizontal period unit.

The emission driver 150 may receive an emission driving signal ECS from the timing controller 120. The emission driving signal ECS may include an emission start signal EFLM and clock signals associated with driving the emission driver 150. The emission driver 150 may generate an emission control signal while shifting the emission start signal in response to the clock signal.

The emission control signal may have a gate-on voltage (for example, enable) or a gate-off voltage (for example, disable). Hereafter, an enable emission scan signal may mean that the gate-on voltage is supplied to the emission control lines EL1 to Elo, and the disable emission control signal may mean that the gate-off voltage is supplied to the emission control lines EL1 to Elo.

As illustrated in FIG. 2, the emission driver 150 may receive the emission start signal EFLM and generate the disable emission control signal while shifting the emission start signal EFLM in response to the clock signal. The emission driver 150 may sequentially supply the disable emission control signal to the emission control lines EL1 to ELo. As illustrated in FIG. 3, the disable emission control signal EM supplied to a P-type transistor may be a high level voltage.

In an embodiment, the emission driver 150 may supply the disable emission control signal EM during the write period and the maintenance period of one frame. For example, the emission driver 150 may perform scanning once during the write period of one frame, and may perform scanning at least once according to the image refresh rate during the maintenance period. Here, when the image refresh rate is reduced (that is, the frame length is increased), since the blank period of one frame is increased, the number of maintenance periods included in one frame may be increased. That is, when the image refresh rate is reduced, the number of repetitions of an operation of supplying the disable emission control signal EM may be increased.

The timing controller 120 may receive input data Din and a control signal CS from a host system through an interface. For example, the timing controller 120 may receive the input data Din and the control signal CS from at least one of a graphics processing unit (GPU), a central processing unit (CPU), and an application processor (AP) included in the host system. The control signal CS may include various signals including a clock signal.

The timing controller 120 may generate the scan driving signal SCS, the data driving signal DCS, and the emission driving signal ECS based on the control signal CS. The scan driving signal SCS, the data driving signal DCS, and the emission driving signal ECS may be supplied to the scan driver 130, the data driver 140, and the emission driver 150, respectively.

The timing controller 120 may rearrange the input data Din to fit a specification of the display device 100. In some aspects, the timing controller 120 may correct the input data Din to generate the output data Dout and supply the output data Dout to the data driver 140. In an embodiment, the timing controller 120 may correct the input data Din in response to an optical measurement result measured in a process.

The power supply 160 may generate various power for driving the display device 100. For example, the power supply 160 may generate first driving power VDD, second driving power VSS, first initialization power Vint1, second initialization power Vint2, and bias power Vbias.

The first driving power VDD may be power that supplies a driving current to the pixels PX. The second driving power VSS may be power that receives the driving current from the pixels PX. During a period in which the pixels PX are set to an emission state, the first driving power VDD may be set to a voltage higher than a voltage of the second driving power VSS.

The first initialization power Vint1 may be a power that initializes a gate electrode of the driving transistor included in each of the pixels PX. The first initialization power Vint1 may be set to a voltage lower than a voltage of the data signal. The second initialization power Vint2 may be power that initializes a first electrode (or an anode electrode) of a light emitting element LD included in each of the pixels PX. The second initialization power Vint2 may be set to a voltage at which the light emitting element LD is turned off. The bias power Vbias may be power for applying an on bias voltage to the driving transistor included in each of the pixels PX.

The first driving power VDD generated by the power supply 160 may be supplied to a first power line PL1, the second driving power VSS may be supplied to a second power line PL2, the first initialization power Vint1 may be supplied to a third power line PL3, the second initialization power Vint2 may be supplied to a fourth power line PL4, and the bias power Vbias may be supplied to a fifth power line PL5. The first power line PL1, the second power line PL2, the third power line PL3, the fourth power line PL4, and the fifth power line PL5 are commonly connected to the pixels PX, but embodiments of the present disclosure are not limited thereto.

In an embodiment, the first power line PL1 may be included among a plurality of power lines, and the plurality of power lines may be connected to different pixels PX. In an embodiment, the second power line PL2 may be included among a plurality of power lines, and the plurality of power lines may be connected to different pixels PX. In an embodiment, the third power line PL3 may be included among a plurality of power lines, and the plurality of power lines may be connected to different pixels PX. In an embodiment, the fourth power line PL4 may be included among a plurality of power lines, and the plurality of power lines may be connected to different pixels PX. In an embodiment, the fifth power line PL5 may be included among a plurality of power lines, and the plurality of power lines may be connected to different pixels PX. That is, in an embodiment of the disclosure, the pixels PX may be connected to one of the first power line PL1, one of the second power line PL2, one of the third power line PL3, one of the fourth power line PL4, and one of the fifth power line PL5.

In an embodiment of the disclosure, the display device 100 may include a flat display device, a curved display device in which a portion of the pixel unit 110 is bent, a flexible display device in which a portion may be folded or bent, and a stretchable display device in which a portion may be expanded and contracted.

In an embodiment of the disclosure, the display device 100 may be a device that displays a moving image or a still image, and may include a portable electronic device such as, for example, a mobile phone, a smart phone, a tablet personal computer, a smart watch, a watch phone, a mobile communication terminal, an electronic notebook, an e-book, a portable multimedia player (PMP), a navigation, and an ultra mobile PC (UMPC). In an embodiment of the disclosure, the display device 100 may include an electronic device such as, for example, a television, a notebook computer, a monitor, a billboard, or Internet of things (IoT).

FIG. 3 is a diagram illustrating a pixel according to an embodiment of the disclosure. FIG. 3 illustrates a pixel positioned on an i-th horizontal line and a j-th vertical line.

Referring to FIG. 3, the pixel PXij according to an embodiment of the disclosure may be connected to corresponding signal lines SL1i, SL2i, SL3i, SL4i, ELk, and DLj. For example, the pixel PXij may be connected to the i-th first scan line SL1i, the i-th second scan line SL2i, the i-th third scan line SL3i, the i-th fourth scan line SL4i, the k-th emission control line ELk, and the j-th data line DLj. In an embodiment, the pixel PXij may be further connected to the first power line PL1, the second power line PL2, the third power line PL3, the fourth power line PL4, and the fifth power line PL5.

The pixel PXij according to an embodiment of the disclosure may include the light emitting element LD and a pixel circuit for controlling a driving current amount supplied to the light emitting element LD.

The light emitting element LD may be connected between the first power line PL1 and the second power line PL2. For example, the first electrode (or the anode electrode) of the light emitting element LD may be electrically connected to the first power line PL1 via a seventh transistor M7, a third node N3, a first transistor M1, a second node N2, and a sixth transistor M6, and a second electrode (or a cathode electrode) of the light emitting element LD may be electrically connected to the second power line PL2. The light emitting element LD may generate light of a predetermined luminance in response to the driving current supplied from the first power line PL1 to the second power line PL2 via the pixel circuit.

The light emitting element LD may be selected as an organic light emitting diode. In some aspects, the light emitting element LD may be selected as an inorganic light emitting diode such as, for example, a micro light emitting diode (LED) or a quantum dot light emitting diode. In some aspects, the light emitting element LD may be an element formed of a composite of an organic material and an inorganic material. In FIG. 3, the pixel PXij is illustrated as including a single light emitting element LD. However, in another embodiment, the pixel PXij may include a plurality of light emitting elements LD, and the plurality of light emitting elements LD may be connected to each other in series, parallel, or series-parallel.

The pixel circuit may include the first transistor M1, a second transistor M2, a third transistor M3, a fourth transistor M4, a fifth transistor M5, the sixth transistor M6, the seventh transistor M7, an eighth transistor M8, and a storage capacitor Cst.

A first electrode of the first transistor M1 (or a driving transistor) may be connected to the second node N2, and a second electrode may be connected to the third node N3. In some aspects, a gate electrode of the first transistor M1 may be connected to a first node N1. The first transistor M1 may control the driving current amount supplied from the first driving power VDD to the second driving power VSS via the light emitting element LD in response to a voltage of the first node N1.

The second transistor M2 may be connected between the data line DLj and the second node N2. In some aspects, a gate electrode of the second transistor M2 may be electrically connected to the first scan line SL1i. The second transistor M2 may be turned on when the enable first scan signal GW is supplied to the first scan line SL1i and electrically connect the data line DLj and the second node N2.

The third transistor M3 may be connected between the first node N1 and the third node N3. The third transistor M3 may be a dual gate transistor including a first sub-transistor M3_1 and a second sub-transistor M3_2. The first sub-transistor M3_1 and the second sub-transistor M3_2 may be connected in series between the first node N1 and the third node N3. In an example in which the third transistor M3 is the dual gate transistor, a leakage current between the first node N1 and the third node N3 may be minimized.

A gate electrode of each of the first sub-transistor M3_1 and the second sub-transistor M3_2 may be electrically connected to the second scan line SL2i. The third transistor M3 (that is, the first sub-transistor M3_1 and the second sub-transistor M3_2) may be turned on when the enable second scan signal GC is supplied to the second scan line SL2i and electrically connect the first node N1 and the third node N3. That is, when the third transistor M3 is turned on, the first transistor M1 may be connected in a diode form.

The fourth transistor M4 may be connected between the first node N1 and the third power line PL3. The fourth transistor M4 may be a dual gate transistor including a third sub-transistor M4_1 and a fourth sub-transistor M4_2. The third sub-transistor M4_1 and the fourth sub-transistor M4_2 may be connected in series between the first node N1 and the third power line PL3. In an example in which the fourth transistor M4 is the dual gate transistor, a leakage current between the first node N1 and the third power line PL3 may be minimized.

A gate electrode of each of the third sub-transistor M4_1 and the fourth sub-transistor M4_2 may be electrically connected to the third scan line SL3i. The fourth transistor M4 (that is, the third sub-transistor M4_1 and the fourth sub-transistor M4_2) may be turned on when the enable third scan signal GI is supplied to the third scan line SL3i and supply a voltage of the first initialization power Vint1 to the first node N1.

A first electrode of the fifth transistor M5 may be connected to the first electrode of the light emitting element LD, and a second electrode may be electrically connected to the fourth power line PL4. In some aspects, a gate electrode of the fifth transistor M5 may be electrically connected to the fourth scan line SL4i. The fifth transistor M5 may be turned on when the enable fourth scan signal GB is supplied to the fourth scan line SL4i and supply a voltage of the second initialization power Vint2 to the first electrode of the light emitting element LD.

When the voltage of the second initialization power Vint2 is supplied to the first electrode of the light emitting element LD, a parasitic capacitor of the light emitting element LD may be discharged. As a residual voltage charged in the parasitic capacitor of the light emitting element LD is discharged (or removed), unintentional micro-emission may be prevented. Therefore, a black expression ability of the pixel PXij may be improved.

A first electrode of the sixth transistor M6 may be electrically connected to the first power line PL1, and a second electrode may be connected to the second node N2. In some aspects, a gate electrode of the sixth transistor M6 may be electrically connected to the emission control line ELk. The sixth transistor M6 may turn off when the disable emission control signal EM is supplied to the emission control line ELk, and the sixth transistor M6 may turn on when the enable emission control signal EM is supplied.

The seventh transistor M7 may be connected between the third node N3 and the first electrode of the light emitting element LD. In some aspects, a gate electrode of the seventh transistor M7 may be electrically connected to the emission control line ELk. The seventh transistor M7 may turn off when the disable emission control signal EM is supplied to the emission control line ELk, and the seventh transistor M7 may turn on when the enable emission control signal EM is supplied.

A first electrode of the eighth transistor M8 (or a bias transistor) may be electrically connected to the fifth power line PL5, and a second electrode may be connected to the second node N2. In some aspects, a gate electrode of the eighth transistor M8 may be electrically connected to the fourth scan line SL4i. The eighth transistor M8 may be turned on when the enable fourth scan signal GB is supplied to the fourth scan line SL4i and electrically connect the fifth power line PL5 and the second node N2.

The storage capacitor Cst may be connected between the first power line PL1 and the first node N1. The storage capacitor Cst may store a voltage applied to the first node N1.

In FIG. 3, the transistors M1 to M8 are illustrated as P-type transistors, but embodiments of the present disclosure are not limited thereto. Some (for example, M3 and M4) of the transistors M1 to M8 may be N-type transistors.

Figure 4A:
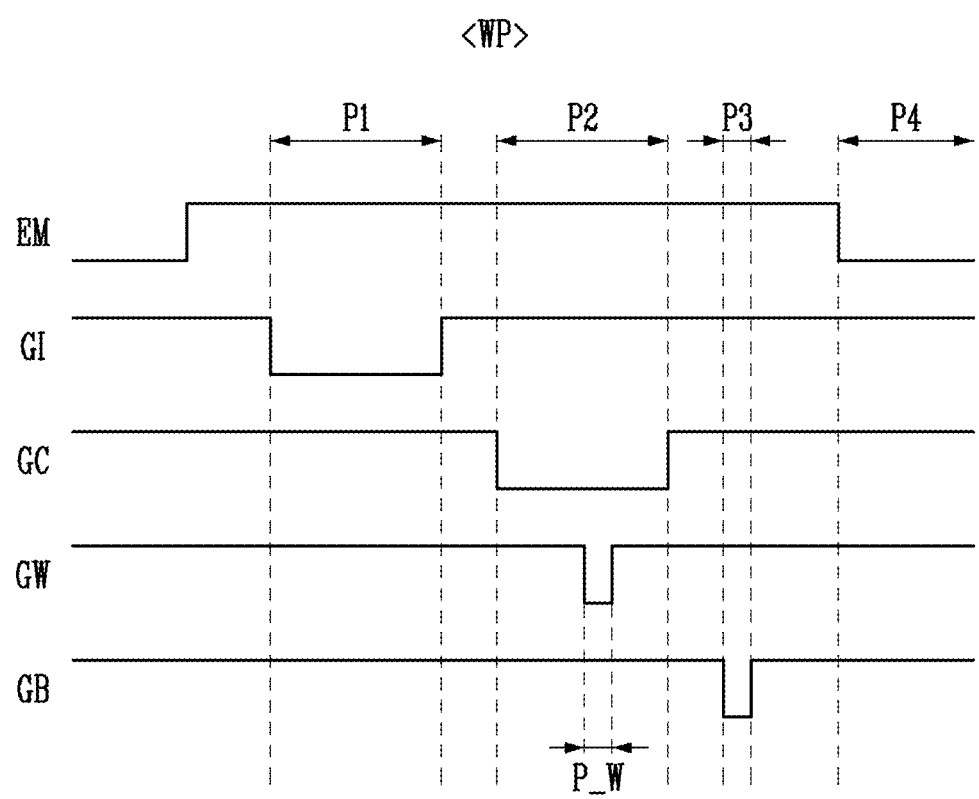
FIGS. 4A and 4B are waveform diagrams illustrating an embodiment of a method of driving a pixel of FIG. 3 during a write period.
Figure 4B:
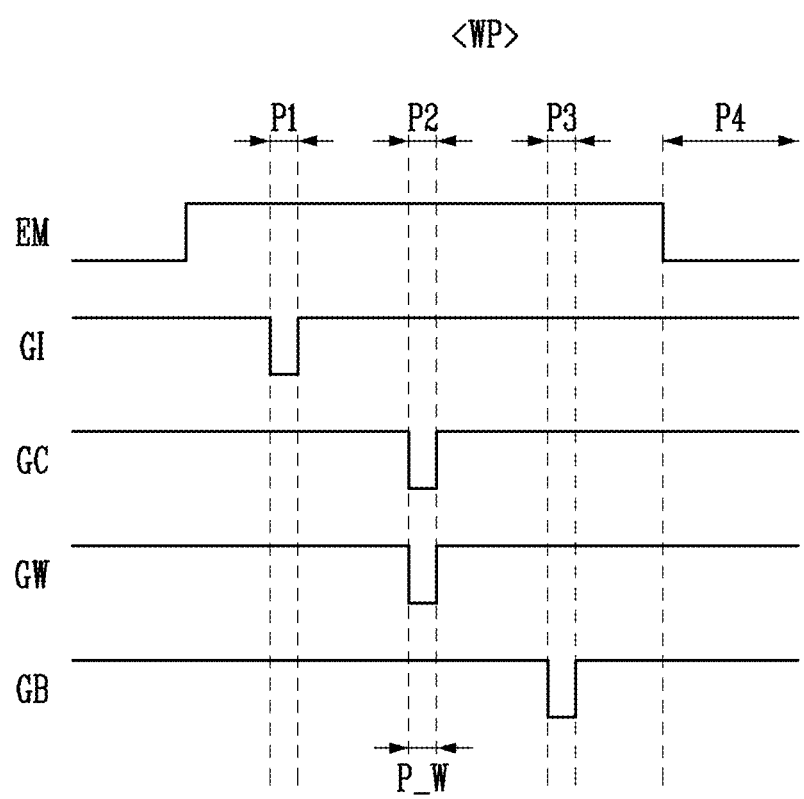

FIGS. 4A and 4B are waveform diagrams illustrating an embodiment of a method of driving the pixel of FIG. 3 during the write period. The write period WP may be included in the active period of the frame.

Referring to FIGS. 3 to 4B, the write period WP may include a first period P1, a second period P2, a third period P3, and a fourth period P4. The first period P1 to the third period P3 may be set as a non-emission period, and the fourth period P4 may be set as an emission period.

The disable emission control signal EM may be supplied to the emission control line ELk during the first period P1 to the third period P3. In an example in which the disable emission control signal EM is supplied to the emission control line ELk, the sixth transistor M6 and the seventh transistor M7 are turned off. In an example in which the sixth transistor M6 and the seventh transistor M7 are turned off, an electrical connection of the first power line PL1 and the light emitting element LD is cut off, and thus the light emitting element LD is set to a non-emission state.

During the first period P1, the enable third scan signal GI is supplied to the third scan line SL3i. In an example in which the enable third scan signal GI is supplied to the third scan line SL3i, the fourth transistor M4 is turned on. In an example in which the fourth transistor M4 is turned on, the voltage of the first initialization power Vint1 of the third power line PL3 may be supplied to the first node N1. In an example in which the voltage of the first initialization power Vint1 is supplied to the first node N1, the gate electrode (that is, the first node N1) of the first transistor M1 may be initialized to the voltage of the first initialization power Vint1. In some aspects, when the voltage of the first initialization power Vint1 is supplied to the first node N1, the first transistor M1 may be set to an on bias state.

During the second period P2, the enable second scan signal GC is supplied to the second scan line SL2i, and thus the third transistor M3 is turned on. In an example in which the third transistor M3 is turned on, the first transistor M1 may be connected in a diode form.

The enable first scan signal GW is supplied to the first scan line SL1i in a write period P_W overlapping the second period P2. In an example in which the enable first scan signal GW is supplied to the first scan line SL1i, the second transistor M2 is turned on. In an example in which the second transistor M2 is turned on, the data signal may be supplied from the data line DLj to the second node N2. Since the first transistor M1 maintains a diode-connected form by the turned-on third transistor M3, the first node N1 may have a voltage in which a threshold voltage of the first transistor M1 is compensated for in the data signal.

During the third period P3, the enable fourth scan signal GB is supplied to the fourth scan line SL4i. In an example in which the enable fourth scan signal GB is supplied to the fourth scan line SL4i, the fifth transistor M5 and the eighth transistor M8 are turned on. In an example in which the fifth transistor M5 is turned on, the voltage of the second initialization power Vint2 may be supplied to the first electrode of the light emitting element LD, and thus the light emitting element LD may be initialized. In an example in which the eighth transistor M8 is turned on, a voltage of the bias power Vbias is supplied to the second node N2. In an example in which the voltage of the bias power Vbias is supplied to the second node N2, the first transistor M1 may be set to the on bias state.

In the fourth period P4, the enable emission control signal EM (or a low level emission control signal) is supplied to the emission control line ELk, and thus the sixth transistor M6 and the seventh transistor M7 are turned on. In an example in which the sixth transistor M6 and the seventh transistor M7 are turned on, a current movement path connected to the second power line PL2 via the first power line PL1, the sixth transistor M6, the first transistor M1, the seventh transistor M7, and the light emitting element LD is formed. At this time, according to an operation of the first transistor M1, a driving current corresponding to the voltage of the first node N1 may flow through the light emitting element LD, and the light emitting element LD may generate light of a predetermined luminance corresponding to the driving current.

In some aspects, as illustrated in FIG. 4A, a width of the enable second scan signal GC and the enable third scan signal GI may be set to be wider than a width of the enable first scan signal GW. In some aspects, as illustrated in FIG. 4B, the width of the enable second scan signal GC and the enable third scan signal GI may be substantially the same as the width of the enable first scan signal GW. In an embodiment of the disclosure, a width of the enable scan signals GW, GC, GI, and GB may be variously set such that the display device 100 may be stably driven.

Figure 5A:
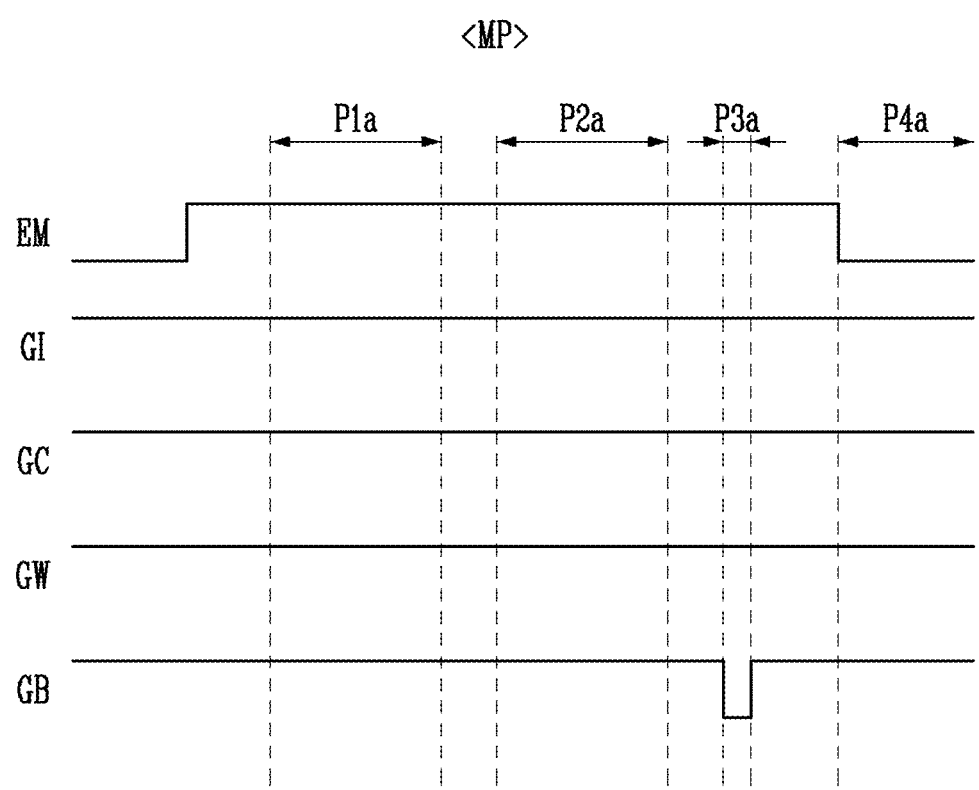
FIGS. 5A and 5B are waveform diagrams illustrating an embodiment of a method of driving the pixel of FIG. 3 during a maintenance period.
Figure 5B:
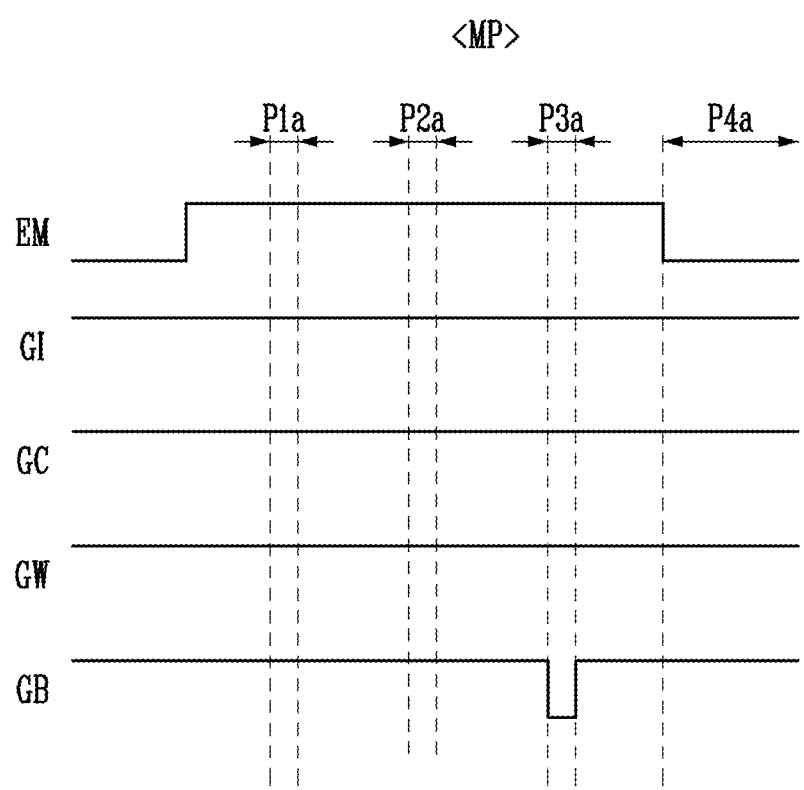

FIGS. 5A and 5B are waveform diagrams illustrating an embodiment of a method of driving the pixel of FIG. 3 during the maintenance period. The maintenance period MP is a period in which light is emitted while maintaining a voltage of a previously supplied data signal, and is a period in which an image is displayed without switching a frame. In an embodiment, one frame may include one write period WP in the active period. In an embodiment, one frame may include at least one maintenance period MP in response to the image refresh rate. In an example in which one frame includes a plurality of maintenance periods MP, the plurality of maintenance periods MP may be disposed successively after the write period WP.

In the maintenance period MP, compared to the write period WP, a threshold voltage compensation operation and a data writing operation may be omitted, and an operation of applying a bias voltage to the first transistor M1 and an operation of initializing the light emitting element LD may be performed. The maintenance period MP may be set to a length similar or identical to a length of the write period WP. The maintenance period MP may include a first period P1a, a second period P2a, a third period P3a, and a fourth period P4a.

Referring to FIGS. 3 to 5B, the disable emission control signal EM is supplied to the emission control line ELk in the first to third periods P1a to P3a. In an example in which the disable emission control signal EM is supplied to the emission control line ELk, the sixth transistor M6 and the seventh transistor M7 are turned off, and thus the light emitting element LD is set to a non-emission state.

The enable first scan signal GW, the enable second scan signal GC, and the enable third scan signal GI are not supplied in the first period P1a to the third period P3a (or the disable scan signals GW, GC, and GI are supplied). Accordingly, in the first period P1a to the third period P3a, the second transistor M2, the third transistor M3, and the fourth transistor M4 are set to a turn-off state.

The enable fourth scan signal GB may be supplied to the fourth scan line SL4i in the third period P3a. In an example in which the enable fourth scan signal GB is supplied to the fourth scan line SL4i, the fifth transistor M5 and the eighth transistor M8 may be turned on.

When the fifth transistor M5 is turned on, the voltage of the second initialization power Vint2 may be supplied to the first electrode of the light emitting element LD, and thus the light emitting element LD may be initialized. In an example in which the eighth transistor M8 is turned on, the voltage of the bias power Vbias is supplied to the second node N2. In an example in which the voltage of the bias power Vbias is supplied to the second node N2, the first transistor M1 may be set to the on bias state.

The display device 100 according to the embodiment of the disclosure described herein may be driven at various image refresh rates because one frame includes the write period WP and the maintenance period MP. For example, the display device 100 may emit or may not emit light at a regular period regardless of the image refresh rate by the write period WP and the maintenance period MP included in one frame, and thus may be driven at various image refresh rates.

Figure 6:
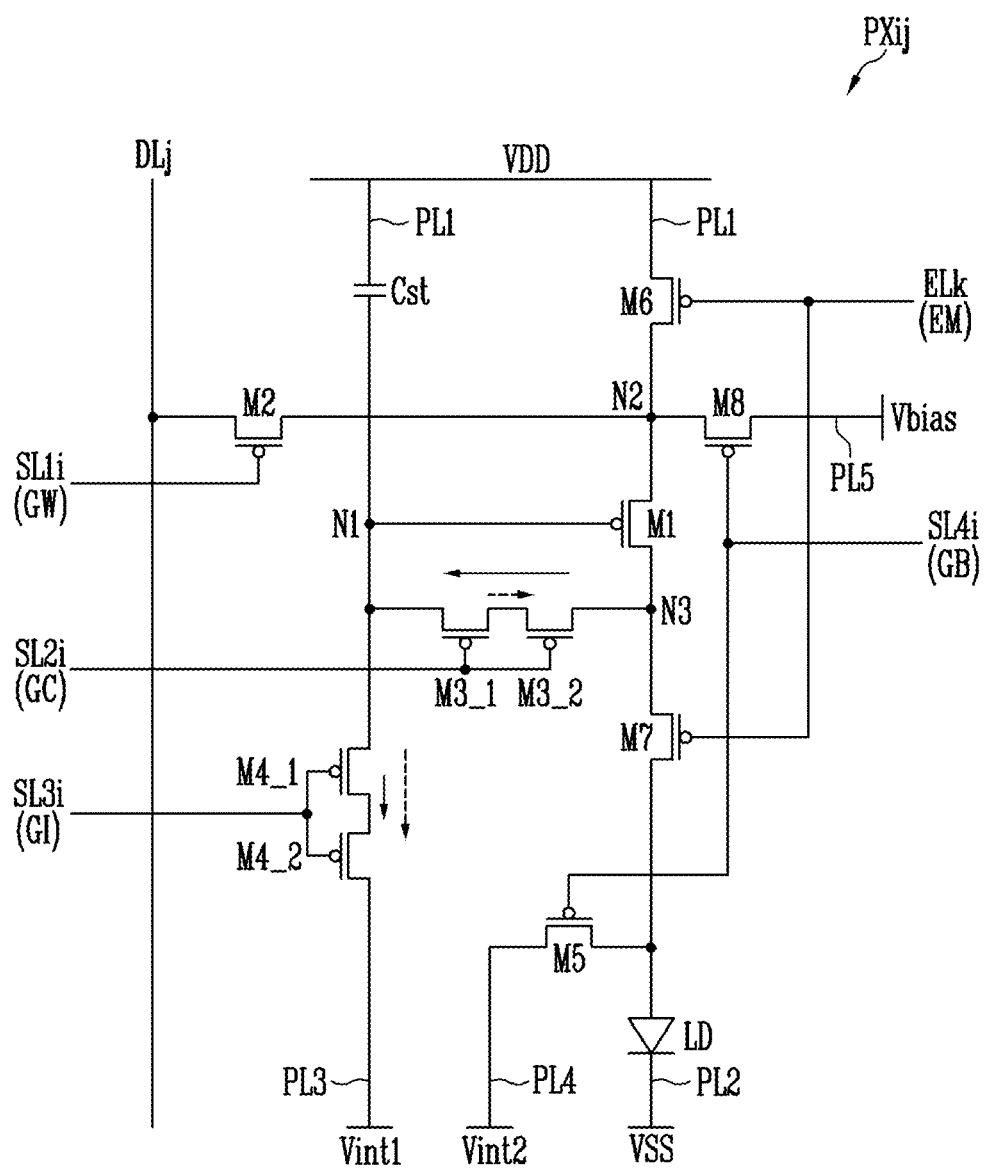
FIG. 6 is a diagram illustrating a leakage current corresponding to a grayscale supplied to the pixel.

FIG. 6 is a diagram illustrating a leakage current corresponding to a grayscale supplied to the pixel. In FIG. 6, a solid arrow may indicate a direction of the leakage current associated with a high grayscale, and a dotted arrow may indicate the direction of the leakage current associated with a low grayscale. Here, a range of the high grayscale and a range of the low grayscale may be set differently in correspondence with a type of the display device (for example, a resolution, a size of the display panel, or the like). For example, the high grayscale may mean approximately 100 grayscales or more, and the low grayscale may mean 30 grayscales or less, but embodiments of the present disclosure are not limited thereto.

Figure 7A:
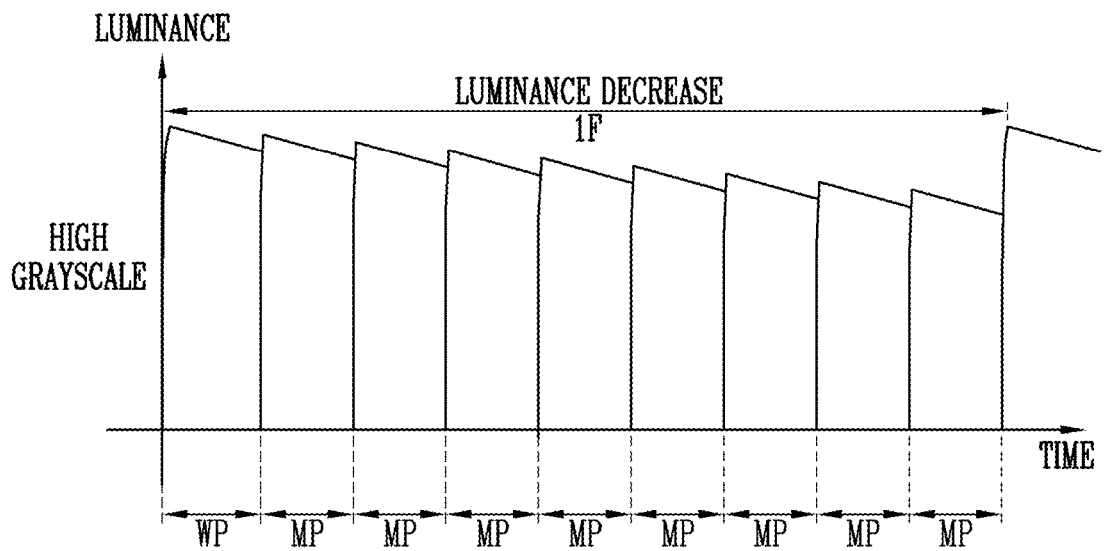
FIGS. 7A and 7B are diagrams illustrating a luminance of a high grayscale and a low grayscale corresponding to the leakage current illustrated in FIG. 6.
Figure 7B:
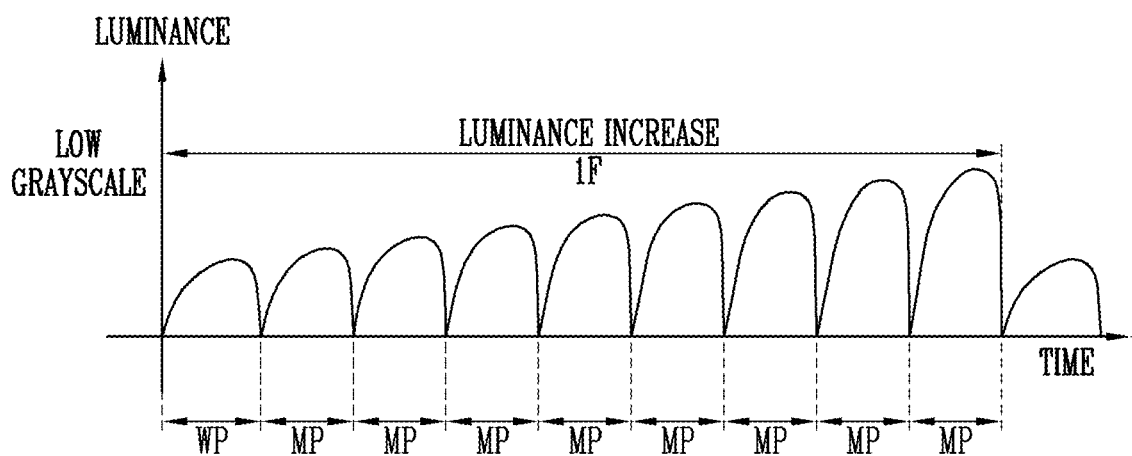

FIGS. 7A and 7B are diagrams illustrating a luminance of the high grayscale and the low grayscale corresponding to the leakage current illustrated in FIG. 6. In FIGS. 7A and 7B, it is assumed that one frame 1F includes 8 maintenance periods MP.

Referring to FIG. 6, when the pixel PXij displays the high grayscale, the voltage of the first node N1 may be set low. Here, since the voltage of the first initialization power Vint1 is set lower than the voltage of the first node N1, the leakage current may flow from the first node N1 to the third power line PL3.

In some aspects, when the voltage of the first node N1 is set low, a large amount of driving current may be supplied from the first power line PL1 to the first electrode (or the third node N3) of the light emitting element LD, and thus the first electrode (or the third node N3) of the light emitting element LD may be set to a high voltage. In this case, the leakage current may flow in a direction from the third node N3 to the first node N1.

When the leakage current is supplied in the direction from the third node N3 to the first node N1, the voltage of the first node N1 may be increased. In this case, as illustrated in FIG. 7A, the luminance of the pixel PXij may be gradually decreased over time.

When the pixel PXij displays the low grayscale, the voltage of the first node N1 may be set high. Here, since the voltage of the first initialization power Vint1 is set lower than the voltage of the first node N1, the leakage current may flow from the first node N1 to the third power line PL3.

In some aspects, when the voltage of the first node N1 is set high, a small amount of driving current may be supplied from the first power line PL1 to the first electrode (or the third node N3) of the light emitting element LD, and thus the first electrode (or the third node N3) of the light emitting element LD may be set to a low voltage. In this case, the leakage current may flow in a direction from the first node N1 to the third node N3.

When the leakage current is supplied in the direction from the first node N1 to the third node N3, the voltage of the first node N1 may be decreased. In this case, as illustrated in FIG. 7B, the luminance of the pixel PXij may be gradually increased over time.

That is, in a case of the pixel of FIG. 3, the luminance may be gradually decreased during one frame period at the high grayscale, and the luminance may be gradually increased during one frame period at the low grayscale. In an example in which the luminance is increased or decreased in response to the grayscales as described herein, tuning the display device 100 to have a desired luminance is difficult.

For example, various methods may be proposed to compensate for a luminance decrease of the high grayscale. For example, a width of the emission control signal supplied in the maintenance period MP may be controlled such that the luminance is gradually increased during one frame period. However, when the width of the emission control signal is controlled such that the luminance is gradually increased, the luminance may be rapidly increased at the low grayscale.

Figure 8:
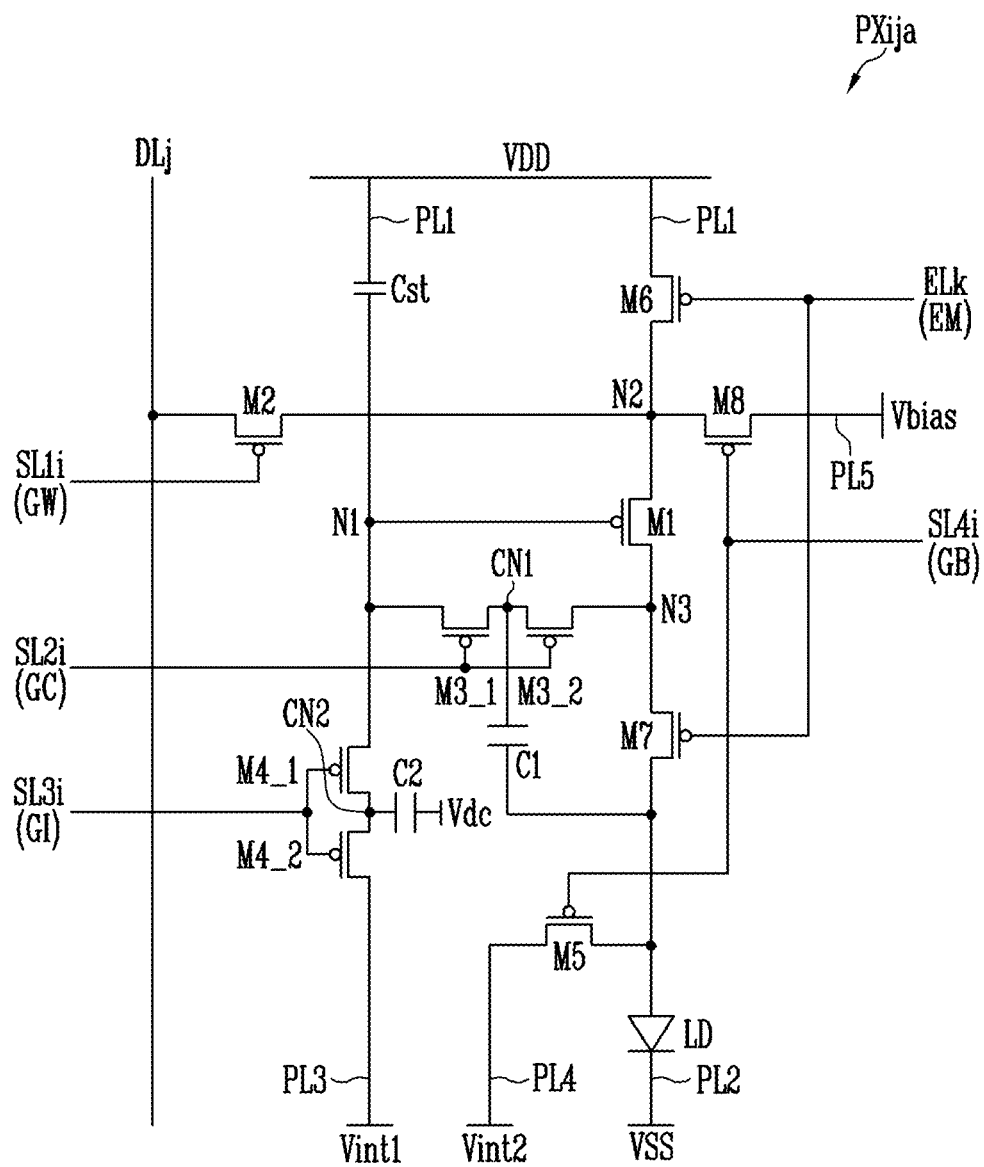
FIG. 8 is a diagram illustrating a pixel according to an embodiment of the disclosure.

FIG. 8 is a diagram illustrating a pixel according to an embodiment of the disclosure. In the descriptions regarding FIG. 8, the same reference numerals are assigned to the same configurations as those of FIG. 3, and an overlapping description is omitted.

Referring to FIG. 8, the pixel PXija according to an embodiment of the disclosure may include the light emitting element LD and a pixel circuit for controlling a driving current amount supplied to the light emitting element LD.

The light emitting element LD may generate light of a predetermined luminance in response to the driving current supplied from the first power line PL1 to the second power line PL2 via the pixel circuit.

The pixel circuit may include the first transistor M1, the second transistor M2, the third transistor M3, the fourth transistor M4, the fifth transistor M5, the sixth transistor M6, the seventh transistor M7, the eighth transistor M8, the storage capacitor Cst, a first capacitor C1, and a second capacitor C2.

The first capacitor C1 may be connected between a first common node CN1 between the first sub-transistor M3_1 and the second sub-transistor M3_2 and the first electrode of the light emitting element LD. The first capacitor C1 may be driven as a coupling capacitor. For example, the first capacitor C1 may change a voltage of the first common node CN1 in response to a voltage change amount of the first electrode of the light emitting element LD. In some aspects, when the first capacitor C1 is formed between the first common node CN1 and the first electrode of the light emitting element LD, a voltage change of the first common node CN1 by a voltage change of signal lines (for example, the scan lines SL1*i*, SL2*i*, SL3*i*, and SL4*i* and the emission control lines ELk) may be minimized.

In some aspects, when the first capacitor C1 is connected to the first common node CN1, a leakage current amount between the third node N3 and the first node N1 may be controlled. For example, the leakage current amount between the third node N3 and the first node N1 may be set differently according to a capacitance of the first capacitor C1. In an example in which the voltage of the first common node CN1 is increased by the first capacitor C1, the leakage current amount between the third node N3 and the first node N1 may be decreased.

The second capacitor C2 may be connected between constant power Vdc and a second common node CN2 between the third sub-transistor M4_1 and the fourth sub-transistor M4_2. Here, the constant power Vdc may be one of power supplied to the pixel PXija. For example, the constant power Vdc may be one of the first driving power VDD, the second driving power VSS, the first initialization power Vint1, the second initialization power Vint2, and the bias power Vbias.

In the example described with reference to FIG. 8, the second capacitor C2 is connected between the second common node CN2 and the constant power Vdc, which supports minimizing a voltage change of the second common node CN2 by the voltage change of the signal lines (for example, the scan lines SL1*i*, SL2*i*, SL3*i*, and SL4*i* and the emission control lines Ek). In some aspects, when the second capacitor C2 is connected between the second common node CN2 and the constant power Vdc, the leakage current amount between the first node N1 and the third power line PL3 may be decreased.

Figure 9:
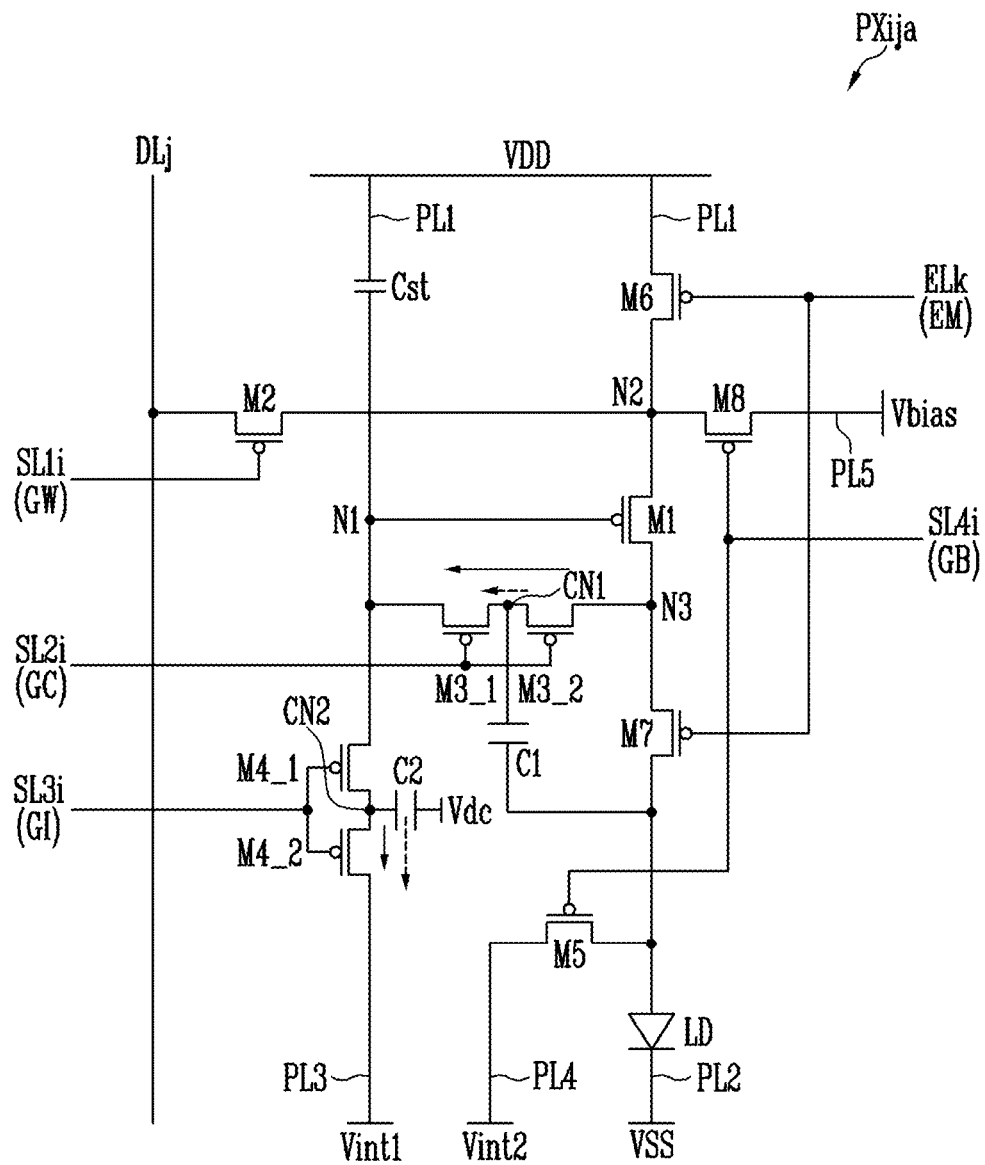
FIG. 9 is a diagram illustrating a leakage current of the pixel illustrated in FIG. 8.

FIG. 9 is a diagram illustrating the leakage current of the pixel illustrated in FIG. 8. In FIG. 9, a solid arrow may indicate a direction of the leakage current at the high grayscale, and a dotted arrow may indicate the direction of the leakage current at the low grayscale. Here, a range of the high grayscale and a range of the low grayscale may be set differently in correspondence with a type of the display device (for example, a resolution, a size of the display panel, or the like).

Referring to FIG. 9, when the pixel PXija displays the high grayscale, the voltage of the first node N1 may be set low. Here, since the voltage of the first initialization power Vint1 is set lower than the voltage of the first node N1, the leakage current may flow from the first node N1 to the third power line PL3.

In some aspects, when the voltage of the first node N1 is set low, a large amount of driving current may be supplied from the first power line PL1 to the first electrode (or the third node N3) of the light emitting element LD, and thus the first electrode (or the third node N3) of the light emitting element LD may be set to a high voltage. In this case, the leakage current may flow in a direction from the third node N3 to the first node N1.

When the pixel PXija displays the low grayscale, the voltage of the first node N1 may be set high. Here, since the voltage of the first initialization power Vint1 is set lower than the voltage of the first node N1, the leakage current may flow from the first node N1 to the third power line PL3.

In some aspects, when the voltage of the first node N1 is set high, a small amount of driving current may be supplied from the first power line PL1 to the first electrode (or the third node N3) of the light emitting element LD, and thus the first electrode (or the third node N3) of the light emitting element LD may be set to a low voltage. At this time, the first electrode of the light emitting element LD may be increased from the voltage of the second initialization power Vint2 to a predetermined voltage.

In some aspects, the voltage of the first common node CN1 may be increased in response to a voltage increase amount of the first electrode of the light emitting element LD by coupling of the first capacitor C1. In an example in which the voltage of the first common node CN1 is increased, the leakage current may flow in a direction from the first common node CN1 to the first node N1.

That is, in the pixel PXija according to an embodiment of the disclosure illustrated in FIG. 8, the leakage current may flow in the same direction at the high grayscale and the low grayscale. The leakage current flowing in the pixel PXija may flow in the direction from the first common node CN1 to the first node N1 and in the direction from the first node N1 to the third power line PL3 regardless of the grayscale. In this case, the display device 100 may be tuned in various methods to have a desired luminance.

In some aspects, the pixel PXija may include a path through which the leakage current flows into the first node N1 (direction from the first common node CN1 to the first node N1) and a path through which the leakage current flows out from the first node N1 (direction from the first node N1 to the third power line PL3). In this case, a voltage change amount of the first node N1 due to the leakage current may be minimized, and thus display quality may be improved. A current amount supplied from the common node CN1 to the first node N1 may be changed by the capacitance of the first capacitor C1. The capacitance of the first capacitor C1 may be experimentally determined to minimize the voltage change amount of the first node N1.

Figure 10A:
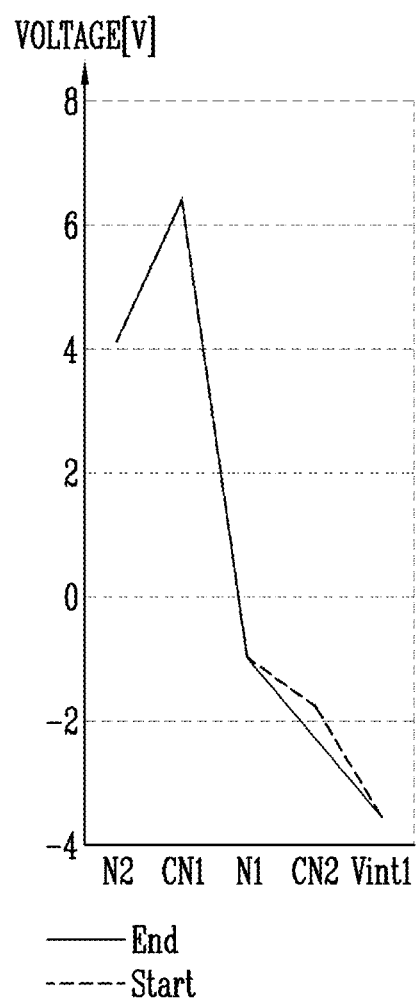
FIGS. 10A and 10B are simulation diagrams illustrating a voltage change amount due to the leakage current of the pixel illustrated in FIG. 8.
Figure 10B:
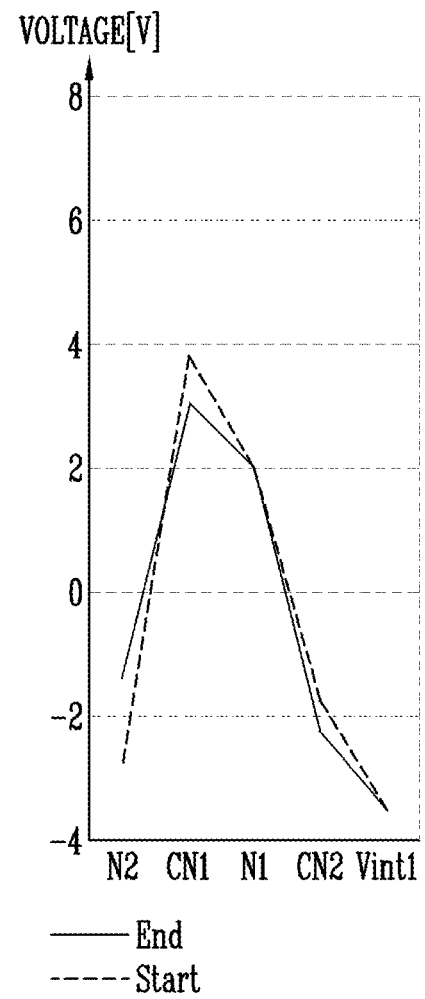

FIGS. 10A and 10B are simulation diagrams illustrating the voltage change amount due to the leakage current of the pixel illustrated in FIG. 8. In FIGS. 10A and 10B, N2 refers to a voltage of the second node N2, CN1 refers to the voltage of the first common node CN1, N1 refers to the voltage of the first node N1, CN2 refers to a voltage of the second common node CN2, and Vint1 refers to the voltage of the first initialization power. In FIGS. 10A and 10B, Start may refer to a time point when the voltage of the data signal is applied to the pixel PXija, and End may refer to a time point when 0.1 seconds has elapsed after the voltage of the data signal is applied to the pixel PXija (for example, 10 Hz driving). In some aspects, in order to proceed with the simulation of FIGS. 10A and 10B, the first driving power VDD is set to 4.6V, the second driving power VSS is set to −4.0V, the first initialization power Vint1 is set to −3.5V, a capacitance of the storage capacitor Cst is set to 70 F, the capacitance of the first capacitor C1 is set to 8.7 F, and a capacitance of the second capacitor C2 is set to 8.7 F.

FIG. 10A corresponds to the voltage change amount of each of the nodes N1, N2, CN1, and CN2 after the voltage of the data signal corresponding to the high grayscale (for example, a white grayscale) is applied to the pixel PXija. It may be confirmed that the voltage of the first node N1 remains constant even after a predetermined time has elapsed after the voltage of the data signal corresponding to the high grayscale is applied to the pixel PXija. For example, a voltage change amount of Vgs of the first transistor M1 may be set to approximately 0V, and thus the pixel PXija according to an embodiment of the disclosure may stably implement a luminance at the high grayscale.

FIG. 10B corresponds to the voltage change amount at each of the nodes N1, N2, CN1, and CN2 after the voltage of the data signal corresponding to the low grayscale (for example, a black grayscale) is applied to the pixel PXija. In an example in which the pixel PXija is driven at the low grayscale, the first common node CN1 is set to a voltage higher than a voltage of the first node N1. Therefore, when the pixel PXija is driven at the low grayscale, the leakage current may flow from the first common node CN1 to the first node N1.

When the pixel PXija is driven at the low grayscale, the first node N1 may include a current input path (direction from the first common node CN1 to the first node N1) and a current output path (from the first node N1 to the third power line PL3), and thus the voltage change amount of the first node N1 may be minimized. For example, a voltage change amount of Vgs of the first transistor M1 0.1 seconds after the data signal is supplied may be set to approximately −0.01V, and thus the pixel PXija according to an embodiment of the disclosure may stably implement a luminance at the low grayscale.

In some aspects, at the low grayscale, the voltage of the first common node CN1 may be decreased after a predetermined time has elapsed. This may be due to the leakage current supplied from the first common node CN1 to the first node N1. However, even though the voltage of the first common node CN1 is decreased, the first node N1 may maintain an approximately constant voltage during a predetermined time (for example, 0.1 seconds), and thus the low grayscale may be stably implemented in the pixel PXija.

Figure 11:
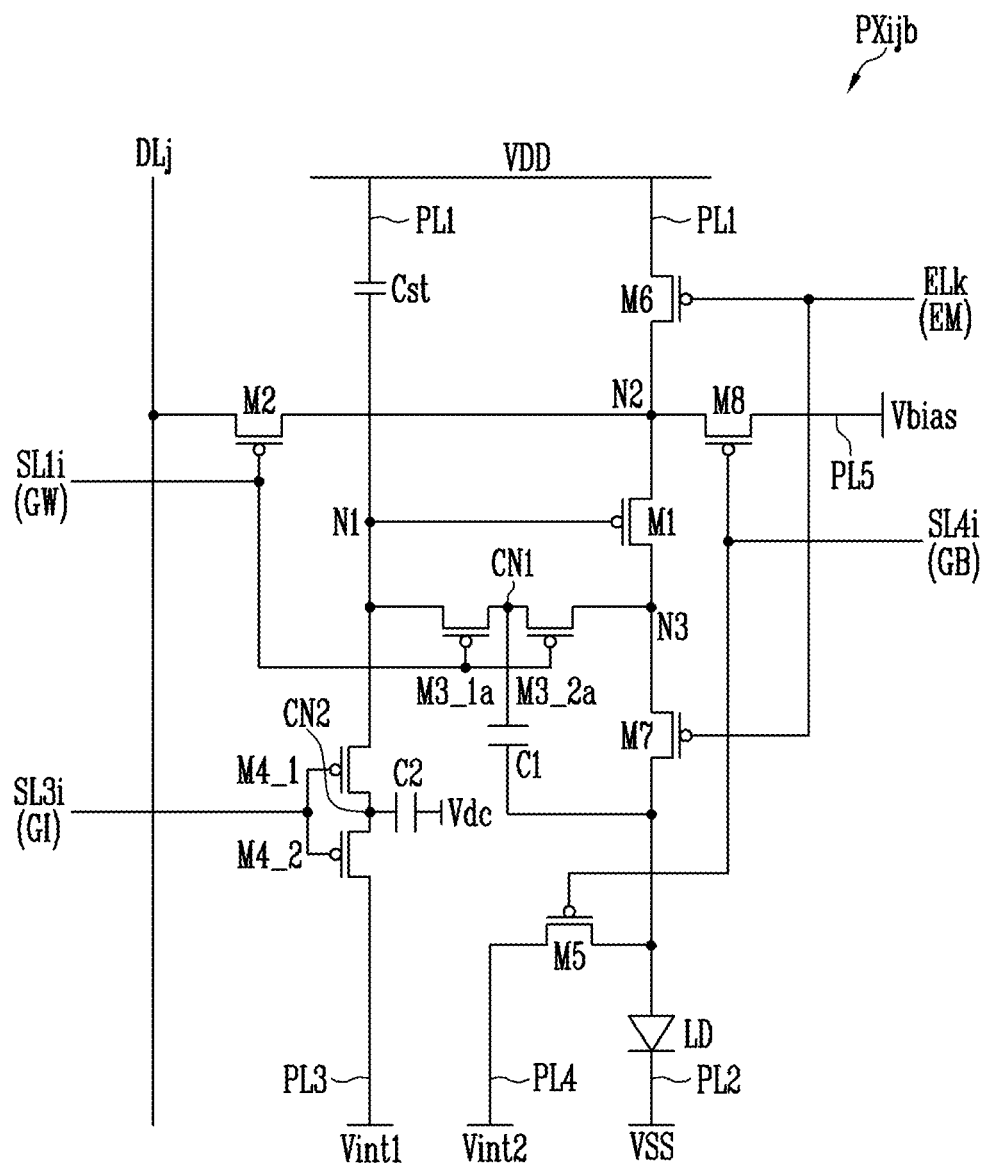
FIG. 11 is a diagram illustrating a pixel according to an embodiment of the disclosure.
Figure 12:
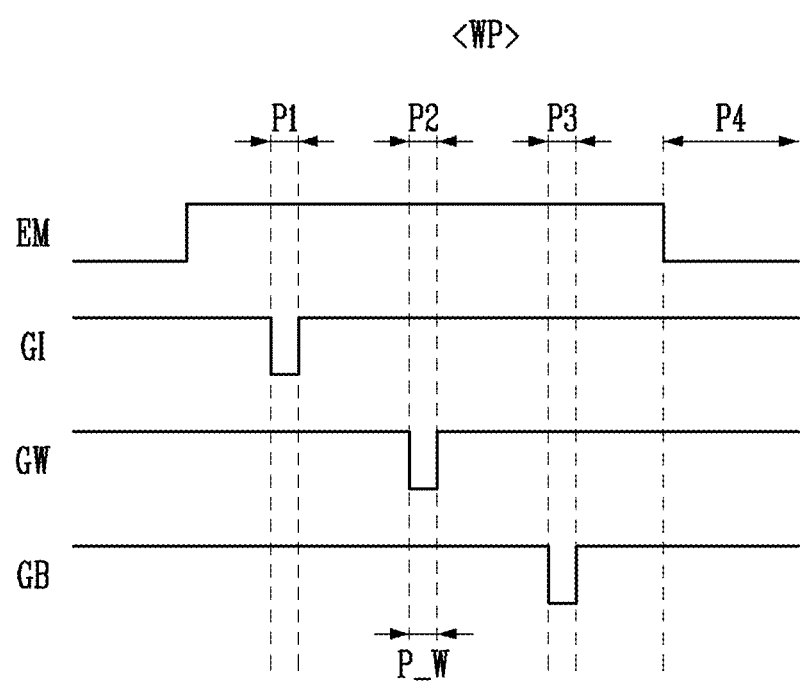
FIG. 12 is a waveform diagram illustrating an embodiment of a method of driving the pixel illustrated in FIG. 11.

FIG. 11 is a diagram illustrating a pixel according to an embodiment of the disclosure. FIG. 12 is a waveform diagram illustrating an embodiment of a method of driving the pixel illustrated in FIG. 11. In the descriptions regarding FIG. 11, the same reference numerals are assigned to the same configurations as those of FIG. 8, and repeated descriptions of like elements are omitted for brevity.

Referring to FIG. 11, the pixel PXijb according to an embodiment of the disclosure may include the light emitting element LD and a pixel circuit for controlling the driving current amount supplied to the light emitting element LD.

The light emitting element LD may generate light of a predetermined luminance in response to the driving current supplied from the first power line PL1 to the second power line PL2 via the pixel circuit.

The pixel circuit may include the first transistor M1, the second transistor M2, a third transistor M3a, the fourth transistor M4, the fifth transistor M5, the sixth transistor M6, the seventh transistor M7, the eighth transistor M8, the storage capacitor Cst, the first capacitor C1, and the second capacitor C2.

The third transistor M3a may include a first sub-transistor M3_1a and a second sub-transistor M3_2a. The first sub-transistor M3_1a and the second sub-transistor M3_2a may be connected in series between the first node N1 and the third node N3. A gate electrode of the third transistor M3a (that is, the first sub-transistor M3_1a and the second sub-transistor M3_2a) may be electrically connected to the first scan line SL1i. The third transistor M3a may be turned on when the first scan signal GW is supplied to the first scan line SL1i and electrically connect the first node N1 and the third node N3. In an example in which the third transistor M3a is turned on, the first transistor M1 may be connected in a diode form.

In the example described with reference to FIG. 11, the third transistor M3a is connected to the first scan line SL1i, and the second scan line SL2i may be omitted (or the first scan line SL1i and the second scan line SL2i may be the same scan line). In this case, as illustrated in FIG. 12, the enable second scan signal GC is not supplied. That is, the third transistor M3a may be driven by the enable first scan signal GW, and thus the number of signal lines connected to each of the pixels PX may be minimized.

The pixel PXijb illustrated in FIG. 11 may have the same configuration as the pixel in FIG. 8 except that the gate electrode of the third transistor M3a is connected to the first scan line SL1i. Similarly, the method of driving the pixel PXijb illustrated in FIG. 12 may be similar or identical to the method described with reference to FIG. 4B. For example, the substantial method may be similar or identical to the method described with reference to FIG. 4B except that the third transistor M3a is driven in response to the enable first scan signal GW supplied to the first scan line SL1i, and thus repeated descriptions of like elements are omitted for brevity.

Figure 13:
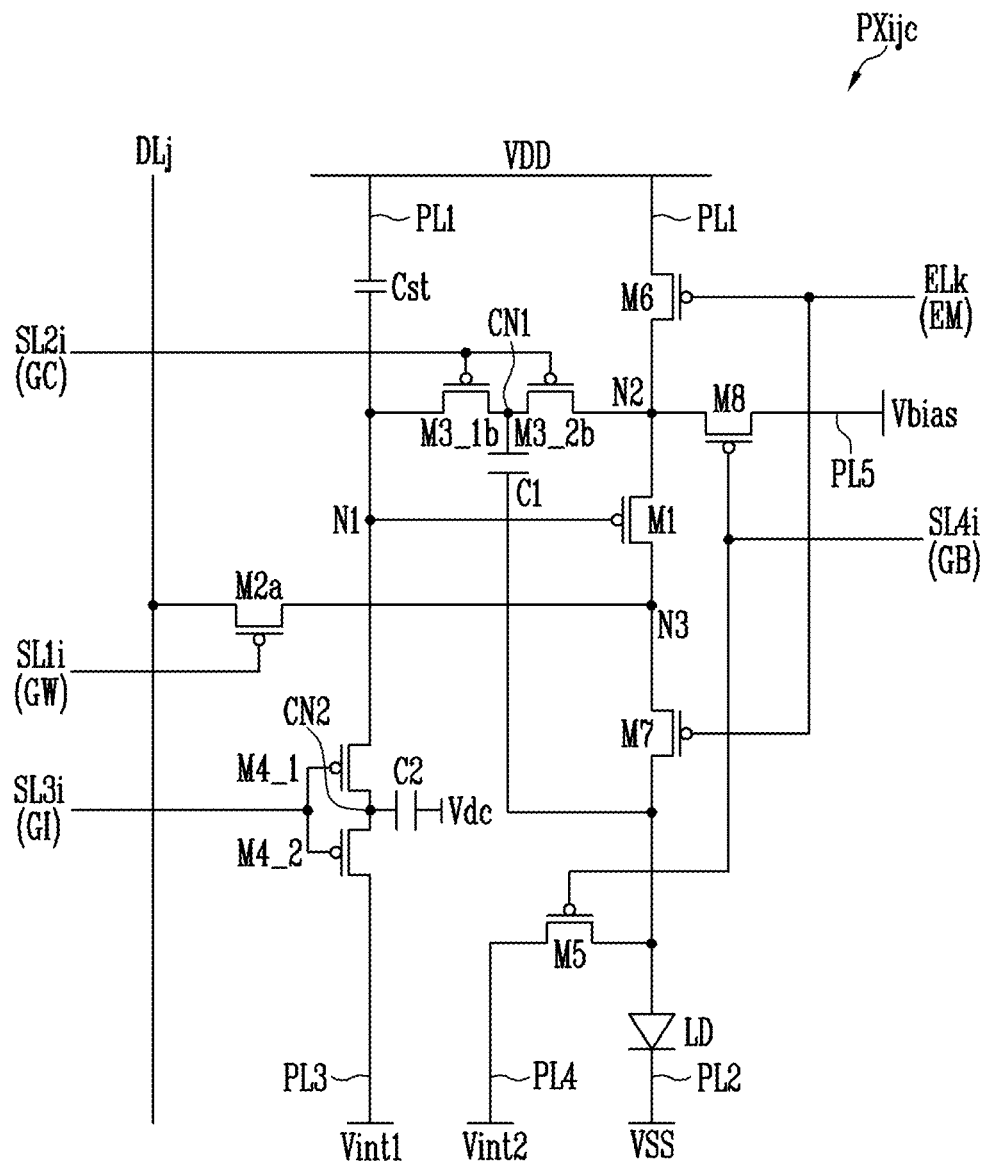
FIG. 13 is a diagram illustrating a pixel according to an embodiment of the disclosure.

FIG. 13 is a diagram illustrating a pixel according to an embodiment of the disclosure. In the descriptions regarding FIG. 13, the same reference numerals is assigned to the same configurations as those of FIG. 8, and repeated descriptions of like elements are omitted for brevity.

Referring to FIG. 13, the pixel PXijc according to an embodiment of the disclosure may include the light emitting element LD and a pixel circuit for controlling the driving current amount supplied to the light emitting element LD.

The light emitting element LD may generate light of a predetermined luminance in response to the driving current supplied from the first power line PL1 to the second power line PL2 via the pixel circuit.

The pixel circuit may include the first transistor M1, a second transistor M2a, a third transistor M3b, the fourth transistor M4, the fifth transistor M5, the sixth transistor M6, the seventh transistor M7, the eighth transistor M8, the storage capacitor Cst, the first capacitor C1, and the second capacitor C2.

The second transistor M2a may be connected between the data line DLj and the third node N3. In some aspects, a gate electrode of the second transistor M2a may be electrically connected to the first scan line SL1i. The second transistor M2a may be turned on when the enable first scan signal GW is supplied to the first scan line SL1i and electrically connect the data line DLj and the third node N3.

The third transistor M3b may be connected between the first node N1 and the second node N2. The third transistor M3b may be a dual gate transistor including a first sub-transistor M3_1b and a second sub-transistor M3_2b. The first sub-transistor M3_1b and the second sub-transistor M3_2b may be connected in series between the first node N1 and the second node N2. In an example in which the third transistor M3b is the dual gate transistor, the leakage current between the first node N1 and the second node N2 may be minimized.

In the example described with reference to FIG. 13, the third transistor M3b is connected between the first node N1 and the second node N2, which supports supplying the leakage current from the second node N2 to the first node N1 regardless of the grayscale. In an example in which the pixel PXijc emits light, the second node N2 may be set to the voltage of the first driving power VDD regardless of the grayscale, and thus the leakage current may flow in a direction from the second node N2 to the first node N1.

The first capacitor C1 may be connected between a first common node CN1 between the first sub-transistor M3_1b and the second sub-transistor M3_2b and the first electrode of the light emitting element LD. The first capacitor C1 may be driven as a coupling capacitor. For example, the first capacitor C1 may change the voltage of the first common node CN1 in response to the voltage change amount of the first electrode of the light emitting element LD. In this case, the leakage current amount supplied from the first common node CN1 to the first node N1 may be controlled. In an example in which the first capacitor C1 is connected between the first common node CN1 and the first electrode of the light emitting element LD, the voltage change of the first common node C1 by the voltage change of the signal lines (for example, the scan lines SL1$i$, SL2$i$, SL3$i$, and SL4$i$ and the emission control lines ELk) may be minimized.

The second capacitor C2 may be connected between the constant power Vdc and the second common node CN2 between the third sub-transistor M4_1 and the fourth sub-transistor M4_2. In an example in which the second capacitor C2 is connected between the second common node CN2 and the constant power Vdc, the voltage change of the second common node CN2 by the voltage change of the signal lines (for example, the scan lines SL1$i$, SL2$i$, SL3$i$, and SL4$i$ and the emission control lines ELk) may be minimized.

The substantial operation process of the pixel PXijc of FIG. 13 may be similar or identical to the substantial operation process of the pixel PXija of FIG. 8 except that positions of the second transistor M2$a$ and the third transistor M3$b$ are changed compared to the pixel PXija of FIG. 8.

When describing the operation process in conjunction with FIGS. 4A, 4B, and 13, the disable emission control signal EM may be supplied to the emission control line ELk during the first period P1 to the third period P3. In an example in which the disable emission control signal EM is supplied to the emission control line ELk, the sixth transistor M6 and the seventh transistor M7 are turned off. In an example in which the sixth transistor M6 and the seventh transistor M7 are turned off, an electrical connection between the first power line PL1 and the light emitting element LD is cut off, and thus the light emitting element LD is set to the non-emission state.

During the first period P1, the enable third scan signal GI is supplied to the third scan line SL3$i$. In an example in which the enable third scan signal GI is supplied to the third scan line SL3$i$, the fourth transistor M4 is turned on. In an example in which the fourth transistor M4 is turned on, the voltage of the first initialization power Vint1 of the third power line PL3 may be supplied to the first node N1. In an example in which the voltage of the first initialization power Vint1 is supplied to the first node N1, the gate electrode (that is, the first node N1) of the first transistor M1 may be initialized to the voltage of the first initialization power Vint1.

During the second period P2, the enable second scan signal GC is supplied to the second scan line SL2$i$, and thus the third transistor M3$b$ is turned on. In an example in which the third transistor M3$b$ is turned on, the first node N1 and the second node N2 may be electrically connected, and thus the first transistor M1 may be connected in a diode form.

The enable first scan signal GW is supplied to the first scan line SL1$i$ in the write period P_W overlapping the second period P2. In an example in which the enable first scan signal GW is supplied to the first scan line SL1$i$, the second transistor M2$a$ is turned on. In an example in which the second transistor M2$a$ is turned on, the data signal may be supplied to the third node N3 from the data line DL$j$. Since the first transistor M1 maintains a diode connected form by the turned-on third transistor M3$b$, the first node N1 may have a voltage in which the threshold voltage of the first transistor M1 is compensated for in the data signal.

During the third period P3, the enable fourth scan signal GB is supplied to the fourth scan line SL4$i$. In an example in which the enable fourth scan signal GB is supplied to the fourth scan line SL4$i$, the fifth transistor M5 and the eighth transistor M8 are turned on. In an example in which the fifth transistor M5 is turned on, the voltage of the second initialization power Vint2 may be supplied to the first electrode of the light emitting element LD, and thus the light emitting element LD may be initialized. In an example in which the eighth transistor M8 is turned on, the voltage of the bias power Vbias is supplied to the second node N2. In an example in which the voltage of the bias power Vbias is supplied to the second node N2, the first transistor M1 may be set to the on bias state.

In the fourth period P4, the enable emission control signal EM (or a low level emission control signal) is supplied to the emission control line ELk, and thus the sixth transistor M6 and the seventh transistor M7 are turned on. In an example in which the sixth transistor M6 and the seventh transistor M7 are turned on, a current movement path connected to the second power line PL2 via the first power line PL1, the sixth transistor M6, the first transistor M1, the seventh transistor M7, and the light emitting element LD is formed. At this time, according to an operation of the first transistor M1, the driving current corresponding to the voltage of the first node N1 may flow through the light emitting element LD, and the light emitting element LD may generate light of a predetermined luminance corresponding to the driving current.

In some aspects, while the pixel PXijc emits light, the voltage of the second node N2 may maintain approximately the voltage of the first driving power VDD regardless of the grayscale. Therefore, the leakage current may flow from the second node N2 to the first node N1 regardless of the grayscale.

Figure 14A:
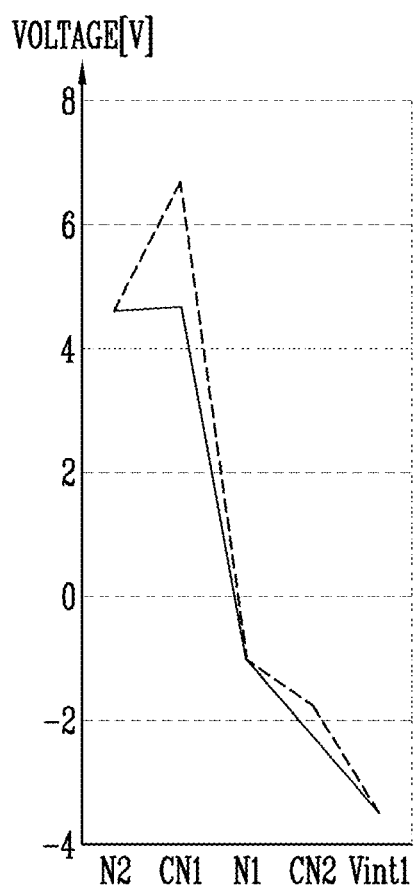
FIGS. 14A and 14B are simulation diagrams illustrating a voltage change amount due to a leakage current of the pixel illustrated in FIG. 13.
Figure 14B:
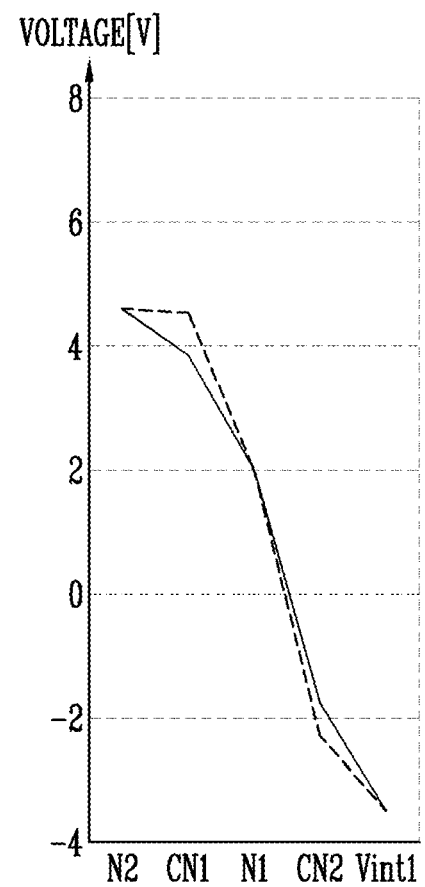

FIGS. 14A and 14B are simulation diagrams illustrating the voltage change amount due to the leakage current of the pixel illustrated in FIG. 13. In FIGS. 14A and 14B, N2 refers to the voltage of the second node N2, CN1 refers to the voltage of the first common node CN1, N1 refers to the voltage of the first node N1, CN2 refers to the voltage of the second common node CN2, and Vint1 refers to the voltage of the first initialization power. In FIGS. 14A and 14B, Start may refer to a time point when the voltage of the data signal is applied to the pixel PXijc, and End may refer to a time point when 0.1 seconds has elapsed after the voltage of the data signal is applied to the pixel PXijc (for example, 10 Hz driving). In some aspects, in order to proceed with the simulation of FIGS. 14A and 14B, the first driving power VDD is set to 4.6V, the second driving power VSS is set to −4.0V, the first initialization power Vint1 is set to −3.5V, the capacitance of the storage capacitor Cst is set to 70 F, the capacitance of the first capacitor C1 is set to 8.7 F, and the capacitance of the second capacitor C2 is set to 8.7 F.

FIG. 14A corresponds to the voltage change amount of each of the nodes N1, N2, CN1, and CN2 after the voltage of the data signal corresponding to the high grayscale (for example, the white grayscale) is applied to the pixel PXijc. It may be confirmed that the voltage of the first node N1 remains constant even after a predetermined time has elapsed after the voltage of the data signal corresponding to the high grayscale is applied to the pixel PXijc. For example, a voltage change amount of Vgs of the first transistor M1 may be set to approximately 0V, and thus the pixel PXija according to an embodiment of the disclosure may stably implement a luminance at the high grayscale.

FIG. 14B corresponds to the voltage change amount at each of the nodes N1, N2, CN1, and CN2 after the voltage of the data signal corresponding to the low grayscale (for example, the black grayscale) is applied to the pixel PXijc. It may be confirmed that the voltage of the first node N1 remains constant even after a predetermined time has elapsed after the voltage of the data signal corresponding to the low grayscale is applied to the pixel PXijc. For example, a voltage change amount of Vgs of the first transistor M1 may be set to approximately −0.01V, and thus the pixel PXijc according to an embodiment of the disclosure may stably implement a luminance at the low grayscale.

Figure 15:
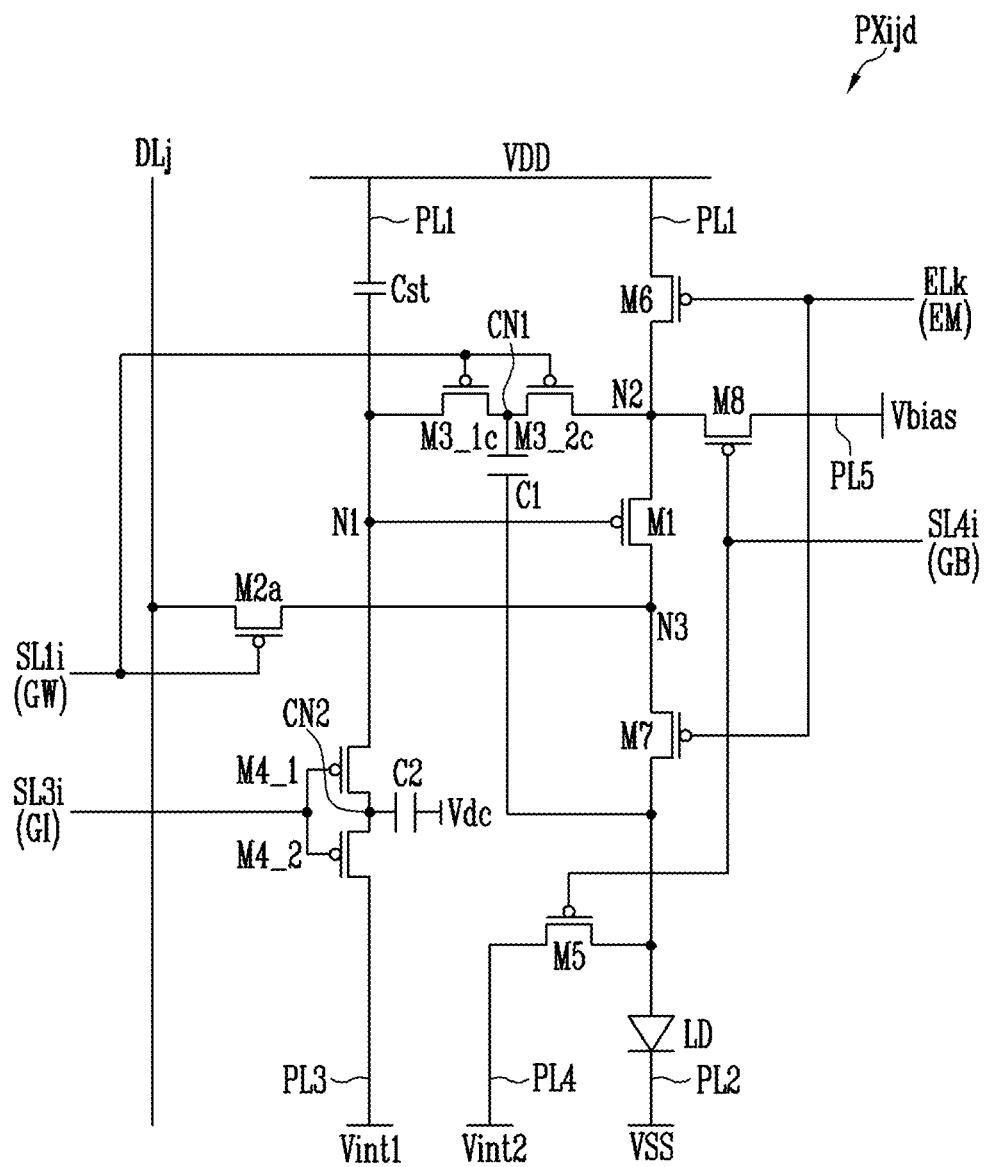
FIG. 15 is a diagram illustrating a pixel according to an embodiment of the disclosure.

FIG. 15 is a diagram illustrating a pixel according to an embodiment of the disclosure. In the descriptions regarding FIG. 15, the same reference numerals are assigned to the same configurations as those of FIG. 13, and repeated descriptions of like elements are omitted for brevity.

Referring to FIG. 15, the pixel PXijd according to an embodiment of the disclosure may include the light emitting element LD and a pixel circuit for controlling the driving current amount supplied to the light emitting element LD.

The light emitting element LD may generate light of a predetermined luminance in response to the driving current supplied from the first power line PL1 to the second power line PL2 via the pixel circuit.

The pixel circuit may include the first transistor M1, the second transistor M2a, a third transistor M3c, the fourth transistor M4, the fifth transistor M5, the sixth transistor M6, the seventh transistor M7, the eighth transistor M8, the storage capacitor Cst, the first capacitor C1, and the second capacitor C2.

The third transistor M3c may include a first sub-transistor M3_1c and a second sub-transistor M3_2c. The first sub-transistor M3_1c and the second sub-transistor M3_2c may be connected in series between the first node N1 and the second node N2. A gate electrode of the third transistor M3c (that is, the first sub-transistor M3_1c and the second sub-transistor M3_2c) may be electrically connected to the first scan line SL1i. The third transistor M3c may be turned on when the first scan signal GW is supplied to the first scan line SL1i and electrically connect the first node N1 and the second node N2. In an example in which the third transistor M3c is turned on, the first transistor M1 may be connected in a diode form.

In the example described with reference to FIG. 15, the third transistor M3c is connected to the first scan line SL1i, and the second scan line SL2i may be omitted (or the first scan line SL1i and the second scan line SL1i may be the same scan line). The pixel PXijb illustrated in FIG. 15 may have the same configuration as the pixel in FIG. 13 except that the gate electrode of the third transistor M3c is connected to the first scan line SL1i.

Figure 16:
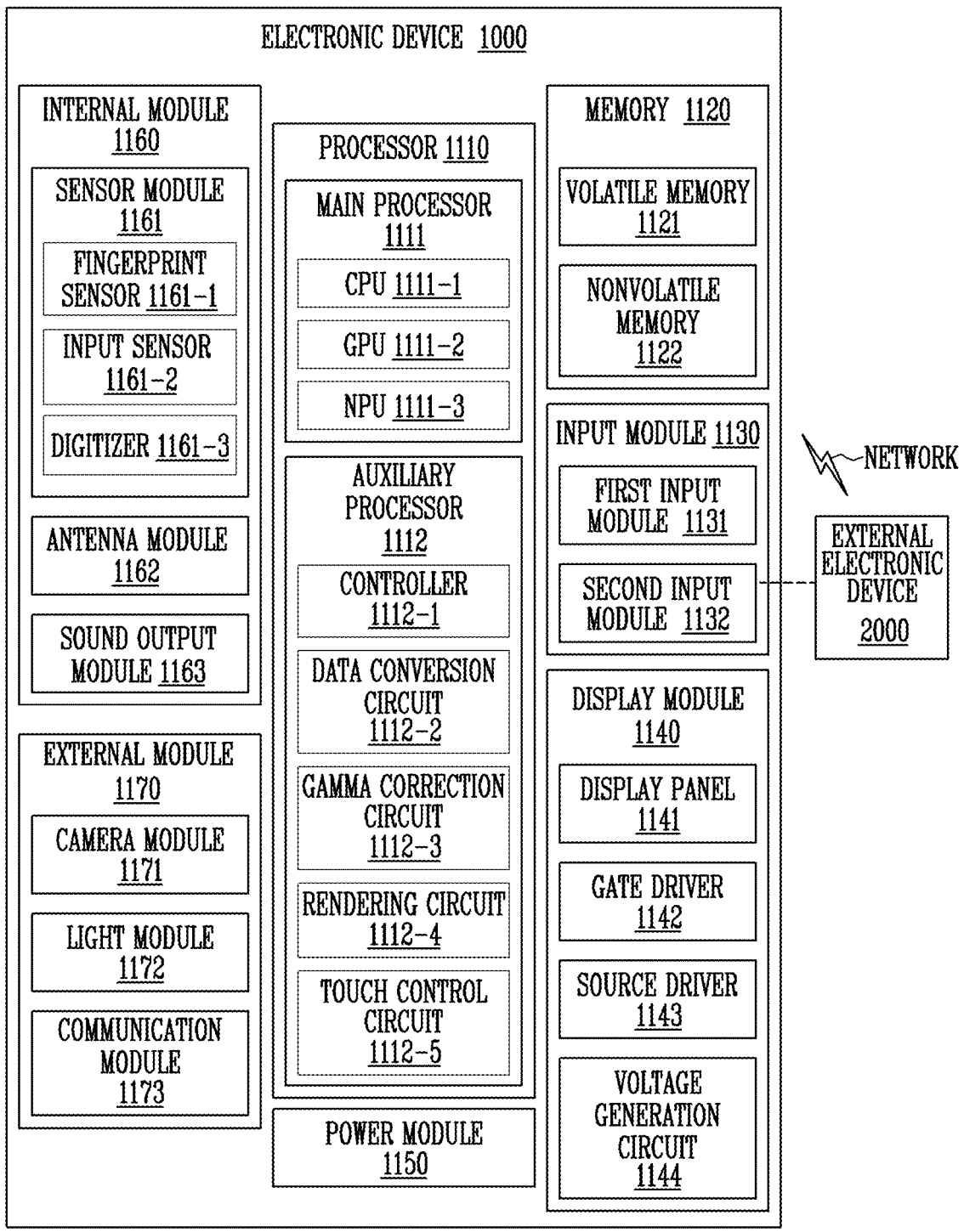
FIG. 16 is a diagram illustrating an electronic device according to an embodiment of the disclosure.

FIG. 16 is a diagram illustrating an electronic device according to an embodiment of the disclosure.

Referring to FIG. 16, the electronic device 1000 outputs various pieces of information through a display module 1140. In an example in which a processor 1110 executes an application stored in a memory 1120, the display module 1140 provides application information to a user through a display panel 1141.

The processor 1110 obtains an external input through an input module 1130 or a sensor module 1161 and executes an application corresponding to the external input. In an example in which the user selects a camera icon (or a camera application icon) displayed on the display panel 1141, the processor 1110 obtains a user input through an input sensor 1161-2 and activates a camera module 1171. The processor 1110 transmits image data corresponding to a captured image obtained through the camera module 1171 to the display module 1140. The display module 1140 may display an image corresponding to the captured image through the display panel 1141.

As another example, when personal information authentication is executed in the display module 1140, a fingerprint sensor 1161-1 obtains input fingerprint information as input data. The processor 1110 compares input data obtained through the fingerprint sensor 1161-1 with authentication data stored in a memory 1120 and executes an application according to a comparison result. The display module 1140 may display information executed according to a logic of the application through the display panel 1141. The fingerprint sensor 1161-1 may be disposed to obtain the fingerprint information from the entire area of the display module 1140 (or the display panel 1141).

As still another example, when a music streaming icon displayed on the display module 1140 is selected, the processor 1110 obtains a user input through the input sensor 1161-2 and activates a music streaming application stored in the memory 1120. In an example in which a music execution command is input in the music streaming application, the processor 1110 activates a sound output module 1163 to provide sound information corresponding to the music execution command to the user.

In the above, an operation of the electronic device 1000 is briefly described. Hereinafter, a configuration of the electronic device 1000 is described in detail. Some of configurations of the electronic device 1000 to be described later may be integrated and provided as one configuration, and one configuration may be separated into two or more configurations and provided.

The electronic device 1000 may communicate with an external electronic device 2000 through a network (for example, a short-range wireless communication network or a long-range wireless communication network). According to an embodiment, the electronic device 1000 may include a processor 1110, a memory 1120, an input module 1130, a display module 1140, a power module 1150, an internal module 1160, and an external module 1170. According to an embodiment, in the electronic device 1000, at least one of the above-described components may be omitted or one or more other components may be added. According to an embodiment, some of the above-described components (for example, the sensor module 1161, an antenna module 1162, or the sound output module 1163) may be integrated into another component (for example, the display module 1140).

The processor 1110 may execute software to control at least another component (for example, a hardware or software component) of the electronic device 1000 connected to the processor 1110, and perform various data processing or operations. According to an embodiment, as at least a portion of the data processing or operation, the processor 1110 may store a command or data received from another component (for example, the input module 1130, the sensor module 1161, or a communication module 1173) in a volatile memory 1121, process the command or the data stored in the volatile memory 1121, and store result data in a nonvolatile memory 1122.

The processor 1110 may include a main processor 1111 and an auxiliary processor 1112. The main processor 1111 may include a central processing unit (CPU) 1111-1. The main processor 1111 may further include any one or more of a graphic processing unit (GPU) 1111-2, a communication processor (CP), and an image signal processor (ISP). The main processor 1111 may further include a neural processing unit (NPU) 1111-3. The NPU 1111-3 is a processor specialized in processing an artificial intelligence model, and the artificial intelligence model may be generated through machine learning. The artificial intelligence model may include a plurality of artificial neural network layers. The artificial neural network may be one of a deep neural network (DNN), a convolutional neural network (CNN), a recurrent neural network (RNN), a restricted boltzmann machine (RBM), a deep belief network (DBN), a bidirectional recurrent deep neural network (BRDNN), a deep Q-network, or a combination of two or more of the above, but is not limited to the above-described example. Additionally or alternatively, the artificial intelligence model may include a software structure in addition to a hardware structure. At least two of the above-described processing units and processors may be implemented as one integrated configuration (for example, a single chip), or each may be implemented as an independent configuration (for example, a plurality of chips).

The auxiliary processor 1112 may include a controller 1112-1. The controller 1112-1 may include an interface conversion circuit and a timing control circuit. For example, the controller 1112-1 may include the timing controller 120 illustrated in FIG. 1. The controller 1112-1 receives an image signal from the main processor 1111, converts a data format of the image signal to correspond to an interface specification with the display module 1140, and outputs image data. The controller 1112-1 may output various control signals associated with driving the display module 1140.

The auxiliary processor 1112 may further include a data conversion circuit 1112-2, a gamma correction circuit 1112-3, a rendering circuit 1112-4, a touch control circuit 1112-5, and the like. The data conversion circuit 1112-2 may receive the image data from the controller 1112-1, compensate the image data to display an image with a desired luminance according to a characteristic of the electronic device 1000, a setting of the user, or the like, or convert the image data for reduction of power consumption, afterimage compensation, or the like.

The gamma correction circuit 1112-3 may convert the image data, a gamma reference voltage, or the like such that the image displayed on the electronic device 1000 has a desired gamma characteristic. The rendering circuit 1112-4 may receive the image data from the controller 1112-1 and render the image data in consideration of a pixel disposition or the like of the display panel 1141 applied to the electronic device 1000.

The touch control circuit 1112-5 may supply a touch signal to the input sensor 1161-2 and receive a sensing signal from the input sensor 1161-2 in response to the touch signal.

At least one of the data conversion circuit 1112-2, the gamma correction circuit 1112-3, the rendering circuit 1112-4, and the touch control circuit 1112-5 may be integrated into another component (for example, the main processor 1111 or the controller 1112-1). At least one of the data conversion circuit 1112-2, the gamma correction circuit 1112-3, and the rendering circuit 1112-4 may be integrated into a source driver 1143 to be described later.

The memory 1120 may store various data used by at least one component (for example, the processor 1110 or the sensor module 1161) of the electronic device 1000, and input data or output data for a command related thereto. In some aspects, various setting data corresponding to setting of the user may be stored in the memory 1120. The memory 1120 may include at least one of the volatile memory 1121 and the nonvolatile memory 1122.

The input module 1130 may receive a command or data to be used by a component (for example, the processor 1110, the sensor module 1161, or the sound output module 1163) of the electronic device 1000 from an outside (for example, the user or the external electronic device 2000) of the electronic device 1000.

The input module 1130 may include a first input module 1131 to which a command or data is input from the user and a second input module 1132 to which a command or data is input from the external electronic device 2000. The first input module 1131 may include a microphone, a mouse, a keyboard, a key (for example, a button), or a pen (for example, a passive pen or an active pen). The second input module 1132 may support a designated protocol capable of connecting to the external electronic device 2000 by wire or wirelessly. According to an embodiment, the second input module 1132 may include a high definition multimedia interface (HDMI), a universal serial bus (USB) interface, an SD card interface, or an audio interface. The second input module 1132 may include a connector capable of physically connecting to the external electronic device 2000, for example, an HDMI connector, a USB connector, an SD card connector, or an audio connector (for example, a headphone connector).

The display module 1140 visually provides information to the user. The display module 1140 may include the display panel 1141, a gate driver 1142, the source driver 1143, and a voltage generation circuit 1144. The display module 1140 may further include a window, a chassis, and a bracket for protecting the display panel 1141. The display module 1140 may include at least a partial configuration of the display device 100 illustrated in FIG. 1.

The display panel 1141 (or a display) may include a liquid crystal display panel, an organic light emitting display panel, or an inorganic light emitting display panel, and a type of the display panel 1141 is not particularly limited. The display panel 1141 may be a rigid type or a flexible type that may be rolled or folded. The display module 1140 may further include a supporter, a bracket, a heat dissipation member, or the like that supports the display panel 1141. The display panel 1141 may include the pixel unit 110 illustrated in FIG. 1. That is, the display panel 1141 may include the pixels PX illustrated in FIG. 1, and each of the pixels PX may include the pixel circuit and the light emitting element LD illustrated in FIGS. 8, 11, 13, and 15.

The gate driver 1142 may be mounted on the display panel 1141 as a driving chip. In some aspects, the gate driver 1142 may be integrated in the display panel 1141. For example, the gate driver 1142 may include an amorphous silicon TFT gate driver circuit (ASG), a low temperature polycrystalline silicon (LTPS) TFT gate driver circuit, or an oxide semiconductor TFT gate driver circuit (OSG) built in the display panel 1141. The gate driver 1142 receives a control signal from the controller 1112-1 and outputs scan signals to the display panel 1141 in response to the control signal. The gate driver 1142 may include the scan driver 130 illustrated in FIG. 1.

The display module 1140 may further include an emission driver. The emission driver outputs an emission control signal to the display panel 1141 in response to the control signal received from the controller 1112-1. The emission driver may be formed separately from the gate driver 1142 or may be integrated into the gate driver 1142. The emission driver may include the emission driver 150 illustrated in FIG. 1.

The source driver 1143 receives a control signal from the controller 1112-1, converts image data into an analog voltage (for example, a data signal) in response to the control signal, and then outputs the data signals to the display panel 1141. The source driver 1143 may include the data driver 140 illustrated in FIG. 1.

The source driver 1143 may be integrated into another component (for example, the controller 1112-1). A function of the interface conversion circuit and the timing control circuit of the controller 1112-1 described herein may be integrated into the source driver 1143. The voltage generation circuit 1144 may output various voltages associated with driving the display panel 1141. As an example, the voltage generation circuit 1144 may include the power supply 160 illustrated in FIG. 1.

In an embodiment, the source driver 1143 may convert data corresponding to red (R), green (G), and blue (B) included in the image data received from the processor into a red data signal (or data voltage), a green data signal, and the blue data signal, and may provide the red data signal, the green data signal, and the blue data signal to the plurality of pixel columns included in the display panel 1141 during one horizontal period.

The power module 1150 supplies power to a component of the electronic device 1000. The power module 1150 may include a battery that charges a power voltage. The battery may include a non-rechargeable primary cell, and a rechargeable secondary cell or fuel cell. The power module 1150 may include a power management integrated circuit (PMIC). The PMIC supplies optimized power to each of the above-described module and a module to be described later. The power module 1150 may include a wireless power transmission/reception member electrically connected to the battery. The wireless power transmission/reception member may include a plurality of antenna radiators of a coil form. In an embodiment, at least a partial configuration of the power module 1150 and the voltage generation circuit 1144 may be integrated into one and provided. As an example, the voltage generation circuit 1144 may be included in the power module 1150.

The electronic device 1000 may further include the internal module 1160 and the external module 1170. The internal module 1160 may include the sensor module 1161, the antenna module 1162, and the sound output module 1163. The external module 1170 may include the camera module 1171, a light module 1172, and the communication module 1173.

The sensor module 1161 may sense an input by a body of the user or an input by a pen among the first input module 1131, and may generate an electrical signal or a data value corresponding to the input. The sensor module 1161 may include at least one of a fingerprint sensor 1161-1, an input sensor 1161-2, and a digitizer 1161-3.

The fingerprint sensor 1161-1 may generate a data value corresponding to a fingerprint of the user.

The input sensor 1161-2 may generate a data value corresponding to coordinate information of the input by the body of the user or the pen. The input sensor 1161-2 generates a capacitance change amount by the input as the data value. The input sensor 1161-2 may sense an input by the passive pen or may transmit/receive data to and from the active pen.

The input sensor 1161-2 may measure a biometric signal such as, for example, blood pressure, water, or body fat. For example, when the user touches a sensor layer or a sensing panel with a body part and does not move during a certain time, the input sensor 1161-2 may sense the biometric signal based on a change of an electric field by the body part and output information desired by the user to the display module 1140.

The digitizer 1161-3 may generate a data value corresponding to coordinate information of the input by the pen. The digitizer 1161-3 generates an electromagnetic change amount by the input as the data value. The digitizer 1161-3 may sense the input by the passive pen or may transmit/receive data to and from the active pen.

At least one of the fingerprint sensor 1161-1, the input sensor 1161-2, and the digitizer 1161-3 may be implemented as the sensor layer formed on the display panel 1141 through a continuous process. At least one of the fingerprint sensor 1161-1, the input sensor 1161-2, and the digitizer 1161-3 may be disposed above the display panel 1141, and any one of the fingerprint sensor 1161-1, the input sensor 1161-2, and the digitizer 1161-3, for example, the digitizer 1161-3 may be disposed below the display panel 1141.

At least two of the fingerprint sensor 1161-1, the input sensor 1161-2, and the digitizer 1161-3 may be formed to be integrated into one sensing panel through the same process. In an example in which at least two of the fingerprint sensor 1161-1, the input sensor 1161-2, and the digitizer 1161-3 are integrated into one sensing panel, the sensing panel may be disposed between the display panel 1141 and a window disposed above the display panel 1141. According to an embodiment, the sensing panel may be disposed on the window, and a position of the sensing panel is not particularly limited.

At least one of the fingerprint sensor 1161-1, the input sensor 1161-2, and the digitizer 1161-3 may be embedded in the display panel 1141. That is, at least one of the fingerprint sensor 1161-1, the input sensor 1161-2, and the digitizer 1161-3 may be simultaneously formed through a process of forming elements (for example, a light emitting element, a transistor, and the like) included in the display panel 1141.

In some aspects, the sensor module 1161 may generate an electrical signal or a data value corresponding to an internal state or an external state of the electronic device 1000. The sensor module 1161 may further include, for example, a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The antenna module 1162 may include one or more antennas for transmitting a signal or power to an outside or receiving a signal or power from an outside. According to an embodiment, the communication module 1173 may transmit a signal to an external electronic device or receive a signal from an external electronic device through an antenna suitable for a communication method. An antenna pattern of the antenna module 1162 may be integrated into one configuration (for example, the display panel 1141) of the display module 1140 or the input sensor 1161-2.

The sound output module 1163 is a device for outputting a sound signal to an outside of the electronic device 1000, and may include, for example, a speaker used for general purposes such as, for example, multimedia playback or recording playback, and a receiver used exclusively for receiving a call. According to an embodiment, the receiver may be formed integrally with or separately from the speaker. A sound output pattern of the sound output module 1163 may be integrated into the display module 1140.

The camera module 1171 may capture a still image and a moving image. According to an embodiment, the camera module 1171 may include one or more lenses, an image sensor, or an image signal processor. The camera module 1171 may further include an infrared camera capable of measuring presence or absence of the user, a position of the user, a gaze of the user, and the like.

The light module 1172 may provide light. The light module 1172 may include a light emitting diode or a xenon lamp. The light module 1172 may operate in conjunction with the camera module 1171 or may operate independently.

The communication module 1173 may support establishment of a wired or wireless communication channel between the electronic device 1000 and the external electronic device 2000 and communication performance through the established communication channel. The communication module 1173 may include any one or both of a wireless communication module such as, for example, a cellular communication module, a short-range wireless communication module, or a global navigation satellite system (GNSS) communication module, and a wired communication module such as, for example, a local area network (LAN) communication module or a power line communication module. The communication module 1173 may communicate with the external electronic device 2000 through a short-range communication network such as, for example, Bluetooth, WiFi direct, or infrared data association (IrDA), or a long-range communication network such as, for example, a cellular network, the Internet, or a computer network (for example, LAN or WAN). The above-described various types of communication modules 1173 may be implemented as a single chip or as separate chips.

The input module 1130, the sensor module 1161, the camera module 1171, and the like may be used to control an operation of the display module 1140 in conjunction with the processor 1110.

The processor 1110 outputs a command or data to the display module 1140, the sound output module 1163, the camera module 1171, or the light module 1172 based on input data received from the input module 1130. For example, the processor 1110 may generate image data in response to the input data applied through a mouse, an active pen, or the like and output the image data to the display module 1140, or generate command data in response to the input data and output the command data to the camera module 1171 or the light module 1172. In an example in which the input data is not received from the input module 1130, the processor 1110 may convert an operation mode of the electronic device 1000 to a low power mode or a sleep mode to reduce power consumed in the electronic device 1000.

The processor 1110 outputs a command or data to the display module 1140, the sound output module 1163, the camera module 1171, or the light module 1172 based on sensing data received from the sensor module 1161. For example, the processor 1110 may compare authentication data applied by the fingerprint sensor 1161-1 with authentication data stored in the memory 1120 and then execute an application according to a comparison result. The processor 1110 may execute the command based on sensing data sensed by the input sensor 1161-2 or the digitizer 1161-3 or output corresponding image data to the display module 1140. In an example in which the sensor module 1161 includes a temperature sensor, the processor 1110 may receive temperature data for a measured temperature from the sensor module 1161 and further perform luminance correction or the like on the image data based on the temperature data.

The processor 1110 may receive measurement data for the presence of the user, the position of the user, the gaze of the user, and the like, from the camera module 1171. The processor 1110 may further perform luminance correction or the like on the image data based on the measurement data. For example, the processor 1110 determining the presence or absence of the user through an input from the camera module 1171 may output image data of which a luminance is corrected through the data conversion circuit 1112-2 or the gamma correction circuit 1112-3 to the display module 1140.

Some of the above-described components may be connected to each other through a communication method between peripheral devices, for example, a bus, general purpose input/output (GPIO), a serial peripheral interface (SPI), a mobile industry processor interface (MIPI), or an ultra path interconnect (UPI) link to exchange a signal (for example, a command or data) with each other. The processor 1110 may communicate with the display module 1140 through a mutually agreed interface, for example, may use any one of the above-described communication methods, and is not limited to the above-described communication method.

Although the above has been described with reference to the embodiments of the disclosure, those skilled in the art will understand that the disclosure may be variously modified and changed without departing from the spirit and scope of the disclosure described in the claims.

What is claimed is:

1. A pixel comprising:
    a first transistor comprising a gate electrode connected to a first node, a first electrode connected to a first power line via a second node, and a second electrode connected to a first electrode of a light emitting element via a third node;
    a light emitting element configured to output light in response to a driving current supplied from the first transistor and comprising a second electrode connected to a second power line;
    a second transistor connected between a data line and the second node and comprising a gate electrode connected to a first scan line;
    a third transistor comprising a first sub-transistor and a second sub-transistor connected in series between the first node and the third node; and
    a first capacitor connected between a first common node between the first sub-transistor and the second sub-transistor and the first electrode of the light emitting element.

2. The pixel according to claim 1, wherein:
    a gate electrode of the first sub-transistor and the second sub-transistor is connected to a second scan line, and
    a turn-on period of the first sub-transistor and the second sub-transistor and a turn-on period of the second transistor at least partially overlap.

3. The pixel according to claim 1, wherein a gate electrode of the first sub-transistor and the second sub-transistor is connected to the first scan line.

4. The pixel according to claim 1, further comprising:
    a fourth transistor connected in series between the first node and a third power line and comprising a third sub-transistor and a fourth sub-transistor comprising a gate electrode connected to a third scan line; and
    a fifth transistor connected between the first electrode of the light emitting element and a fourth power line and comprising a gate electrode connected to a fourth scan line.

5. The pixel according to claim 4, further comprising:
    a second capacitor connected between a constant power and a second common node between the third sub-transistor and the fourth sub-transistor.

6. The pixel according to claim 5, further comprising:
a sixth transistor connected between the first power line and the second node and comprising a gate electrode connected to an emission control line;
a seventh transistor connected between the third node and the first electrode of the light emitting element and comprising a gate electrode connected to the emission control line;
an eighth transistor connected between the second node and a fifth power line and comprising a gate electrode connected to the fourth scan line; and
a storage capacitor connected between the first power line and the first node.

7. The pixel according to claim 6, wherein the constant power is one of first driving power supplied to the first power line, second driving power supplied to the second power line, first initialization power supplied to the third power line, second initialization power supplied to the fourth power line, and bias power supplied to the fifth power line.

8. A pixel comprising:
a first transistor comprising a gate electrode connected to a first node, a first electrode connected to a first power line via a second node, and a second electrode connected to a first electrode of a light emitting element via a third node;
a light emitting element configured to output light in response to a driving current supplied from the first transistor and comprising a second electrode connected to a second power line;
a second transistor connected between a data line and the third node and comprising a gate electrode connected to a first scan line;
a third transistor comprising a first sub-transistor and a second sub-transistor connected in series between the first node and the second node; and
a first capacitor connected between a first common node between the first sub-transistor and the second sub-transistor and the first electrode of the light emitting element.

9. The pixel according to claim 8, wherein a gate electrode of the first sub-transistor and the second sub-transistor is connected to a second scan line, and
a turn-on period of the first sub-transistor and the second sub-transistor and a turn-on period of the second transistor at least partially overlap.

10. The pixel according to claim 8, wherein a gate electrode of the first sub-transistor and the second sub-transistor is connected to the first scan line.

11. The pixel according to claim 8, further comprising:
a fourth transistor connected in series between the first node and a third power line and comprising a third sub-transistor and a fourth sub-transistor comprising a gate electrode connected to a third scan line; and
a fifth transistor connected between the first electrode of the light emitting element and a fourth power line and comprising a gate electrode connected to a fourth scan line.

12. The pixel according to claim 11, further comprising:
a second capacitor connected between a constant power and a second common node between the third sub-transistor and the fourth sub-transistor.

13. The pixel according to claim 12, further comprising:
a sixth transistor connected between the first power line and the second node and comprising a gate electrode connected to an emission control line;
a seventh transistor connected between the third node and the first electrode of the light emitting element and comprising a gate electrode connected to the emission control line;
an eighth transistor connected between the second node and a fifth power line and comprising a gate electrode connected to the fourth scan line; and
a storage capacitor connected between the first power line and the first node.

14. The pixel according to claim 13, wherein the constant power is one of first driving power supplied to the first power line, second driving power supplied to the second power line, first initialization power supplied to the third power line, second initialization power supplied to the fourth power line, and bias power supplied to the fifth power line.

15. A display device comprising:
pixels connected to scan lines, emission control lines, and data lines,
wherein at least one of the pixels comprises:
a first transistor comprising a gate electrode connected to a first node, a first electrode connected to a first power line via a second node, and a second electrode connected to a first electrode of a light emitting element via a third node;
a light emitting element configured to output light in response to a driving current supplied from the first transistor and comprising a second electrode connected to a second power line;
a second transistor connected between a specific data line among the data lines and the second node or the third node, the second transistor comprising a gate electrode connected to a first scan line comprised among the scan lines;
a third transistor connected in series between the first node and the second node or the third node, the third transistor comprising a first sub-transistor and a second sub-transistor each comprising a gate electrode connected to a second scan line comprised among the scan lines; and
a first capacitor connected between a first common node between the first sub-transistor and the second sub-transistor and the first electrode of the light emitting element.

16. The display device according to claim 15, wherein:
the second transistor is connected between the specific data line and the second node, and the third transistor is connected between the first node and the third node, or
the second transistor is connected between the specific data line and the third node, and the third transistor is connected between the first node and the second node.

17. The display device according to claim 15, wherein the first scan line and the second scan line are the same scan line.

18. The display device according to claim 15, wherein the at least one of the pixels further comprises:
a fourth transistor connected in series between the first node and a third power line and comprising a third sub-transistor and a fourth sub-transistor comprising a gate electrode connected to a third scan line;
a fifth transistor connected between the first electrode of the light emitting element and a fourth power line and comprising a gate electrode connected to a fourth scan line; and
a second capacitor connected between a constant power and a second common node between the third sub-transistor and the fourth sub-transistor.

19. The display device according to claim 18, wherein the at least one of the pixels further comprises:

a sixth transistor connected between the first power line and the second node and comprising a gate electrode connected to an emission control line;

a seventh transistor connected between the third node and the first electrode of the light emitting element and comprising a gate electrode connected to the emission control line;

an eighth transistor connected between the second node and a fifth power line and comprising a gate electrode connected to the fourth scan line; and a storage capacitor connected between the first power line and the first node.

20. The display device according to claim 19, wherein the constant power is one of first driving power supplied to the first power line, second driving power supplied to the second power line, first initialization power supplied to the third power line, second initialization power supplied to the fourth power line, and bias power supplied to the fifth power line.

21. An electronic device comprising:

a display panel comprising pixels;

a display module comprising drivers for controlling the display panel; and a processor configured to control the display module, wherein at least one of the pixels comprises:

a first transistor comprising a gate electrode connected to a first node, a first electrode connected to a first power line via a second node, and a second electrode connected to a first electrode of a light emitting element via a third node;

a light emitting element configured to output light in response to a driving current supplied from the first transistor and comprising a second electrode connected to a second power line;

a second transistor connected between a specific data line comprised among data lines and the second node or the third node, the second transistor comprising a gate electrode connected to a first scan line comprised among scan lines;

a third transistor connected in series between the first node and the second node or the third node, the third transistor comprising a first sub-transistor and a second sub-transistor each comprising a gate electrode connected to a second scan line comprised among the scan lines; and a first capacitor connected between a first common node between the first sub-transistor and the second sub-transistor and the first electrode of the light emitting element.

22. The electronic device according to claim 21, wherein the first scan line and the second scan line are the same scan line.

* * * * *